(12) United States Patent
Kub et al.

(10) Patent No.: US 9,029,833 B2
(45) Date of Patent: May 12, 2015

(54) GRAPHENE ON SEMICONDUCTOR DETECTOR

(71) Applicants: Francis J. Kub, Arnold, MD (US); Karl D. Hobart, Alexandria, VA (US); Travis J. Anderson, Alexandria, VA (US)

(72) Inventors: Francis J. Kub, Arnold, MD (US); Karl D. Hobart, Alexandria, VA (US); Travis J. Anderson, Alexandria, VA (US)

(73) Assignee: The Government of the United States of America, as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 14/471,001

(22) Filed: Aug. 28, 2014

(65) Prior Publication Data
US 2014/0367824 A1    Dec. 18, 2014

Related U.S. Application Data

(63) Continuation of application No. 13/630,257, filed on Sep. 28, 2012, now Pat. No. 8,872,159.

(60) Provisional application No. 61/540,706, filed on Sep. 29, 2011.

(51) Int. Cl.
| | |
|---|---|
| *H01L 29/06* | (2006.01) |
| *H01L 31/00* | (2006.01) |
| *H01L 31/028* | (2006.01) |
| *H01L 27/148* | (2006.01) |
| *H01L 31/0336* | (2006.01) |
| *H01L 27/146* | (2006.01) |

(52) U.S. Cl.
CPC ............ *H01L 31/028* (2013.01); *H01L 27/148* (2013.01); *H01L 31/0336* (2013.01); *H01L 27/14643* (2013.01); *H01L 27/14692* (2013.01); *H01L 27/14694* (2013.01)

(58) Field of Classification Search
CPC .............. H01L 31/0336; H01L 27/148; H01L 27/1643
USPC ....................................... 257/21, 82
See application file for complete search history.

(56) References Cited

U.S. PATENT DOCUMENTS

| | | | |
|---|---|---|---|
| 8,461,571 B2 * | 6/2013 | Colli ............................... 257/21 |
| 2010/0200755 A1 * | 8/2010 | Kawano et al. ............ 250/338.4 |

FOREIGN PATENT DOCUMENTS

| | | |
|---|---|---|
| WO | 2011016837 A1 | 2/2011 |
| WO | WO 2011016837 A1 * | 2/2011 |

OTHER PUBLICATIONS

Navneet Soin, Susanta Sinha Roy, Teck H. Lim, and James A.D. McLaughlin, "Microstructural and electrochemical properties of vertically aligned few layered graphene (FLG) nanoflakes and their application in methanol oxidation," Materials Chemistry and Physics, 129 (2011), pp. 1051-1057.

*Primary Examiner* — David Vu
*Assistant Examiner* — Brandon Fox
(74) *Attorney, Agent, or Firm* — US Naval Research Laboratory; Joslyn Barritt

(57) ABSTRACT

Ultraviolet or Extreme Ultraviolet and/or visible detector apparatus and fabrication processes are presented, in which the detector includes a thin graphene electrode structure disposed over a semiconductor surface to provide establish a potential in the semiconductor material surface and to collect photogenerated carriers, with a first contact providing a top side or bottom side connection for the semiconductor structure and a second contact for connection to the graphene layer.

15 Claims, 19 Drawing Sheets

GRAPHENE ON SEMICONDUCTOR DETECTOR

REFERENCE TO RELATED APPLICATIONS

This application is a Continuation of and claims the benefit of priority under 35 U.S.C. §120 based on U.S. patent application Ser. No. 13/630,257 filed on Sep. 28, 2012, which in turn is a Nonprovisional of and claims the benefit of priority under 35 U.S.C. §119 based on U.S. Provisional Patent Application Ser. No. 61/540,706 filed Sep. 29, 2011, both of which are hereby incorporated into the present disclosure.

BACKGROUND

Photodetectors are used in a wide variety of applications to sense visible light and other electromagnetic radiation, such as for recording images in astronomy, digital photography, and digital cinematography, etc. Certain applications involve detection of Ultraviolet (UV) and/or Extreme Ultraviolet (EUV or XUV) radiation, where UV involves wavelengths from about 10 nm to 400 nm and is thus shorter than visible light but longer than X-rays, corresponding to photon energies from about 3 eV to 124 eV. EUV is often regarded as high-energy electromagnetic radiation having wavelengths in a range of about 10 nm to 120 nm involving photons with energies from 10-124 eV. An array of photodetector cells is typically used to measure the levels of received photons in many applications, such as photoelectron spectroscopy, solar imaging, etc. Conventional UV and EUV photodetectors are often built using silicon, but this material has relatively small energy bandgap, whereby a need remains for improved ultraviolet and extreme ultraviolet wavelength photodetector apparatus. Backside illuminated active pixel, hybrid, and charge coupled device imagers often have a dead layer on the backside that degrade the imager quantum efficiency especially at ultraviolet wavelengths. Electron bombarded imagers typically have the electron flux incident on the backside of a silicon active pixel or charge coupled device read out structure. The electron bombarded imager requires a highly conductive layer on the backside of the imager to conduct away the opposite carrier type that is collected by the active pixel or charge coupled readout. An issue for backside illuminated monolithic active pixel and hybrid imager with thin silicon absorption layer that can be fully depleted is establishing the potential at the backside of the imager.

SUMMARY OF DISCLOSURE

Various details of the present disclosure are hereinafter summarized to facilitate a basic understanding, where this summary is not an extensive overview of the disclosure, and is intended neither to identify certain elements of the disclosure, nor to delineate the scope thereof. Rather, the primary purpose of this summary is to present some concepts of the disclosure in a simplified form prior to the more detailed description that is presented hereinafter.

Ultraviolet (UV) and/or Extreme Ultraviolet (EUV) wavelength photodetector and imager structures are disclosed in which a graphene electrode is used to collect photogenerated carriers and establish a potential on the surface of a semiconductor material. Backside illuminated detector and imagers are disclosed that have a thin backside graphene transparent conductive layer. A variety of types of photodetectors are possible, including without limitation active pixel photodetectors, monolithic active pixel photodetectors, hybrid photodetectors, non-avalanched photodetectors, avalanched photodetectors and/or Geiger mode photodetectors. A portion of the graphene electrode is provided to collect photogenerated carriers on a front or top side to establish a potential on the surface of the semiconductor or to conduct photogenerated current with low sheet resistance especially for electron bombarded imagers, and various embodiments have top or bottom side contacts connected to the semiconductor material. Ohmic or Schottky metal contacts may be used for the semiconductor material connection, and various different embodiments may include mechanical support substrate structures created by a variety of processes. More than one photo detector cell may be provided in a given apparatus, with isolation structures being used to separate cells from one another.

BRIEF DESCRIPTION OF THE DRAWINGS

The following description and drawings set forth certain illustrative implementations of the disclosure in detail, which are indicative of several exemplary ways in which the various principles of the disclosure may be carried out. The illustrated examples, however, are not exhaustive of the many possible embodiments of the disclosure. Other objects, advantages, and novel features of the disclosure will be set forth in the following detailed description when considered in conjunction with the drawings, in which.

DETAILED DESCRIPTION OF THE DISCLOSURE

Figure 1:
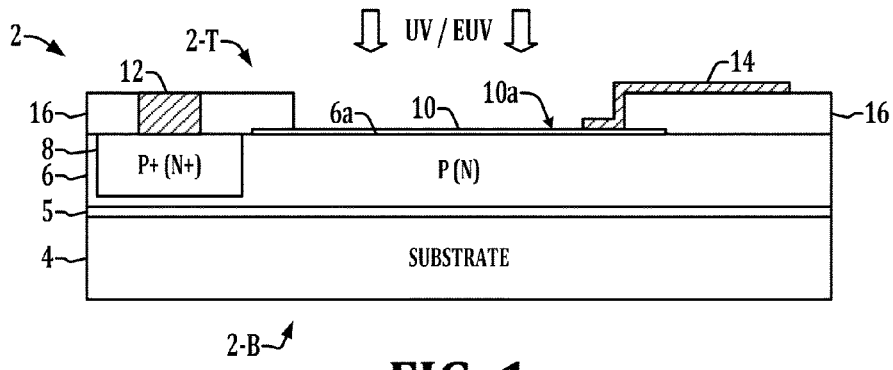
FIG. 1 is a partial sectional side elevation view of a single cell in a UV or EUV detector apparatus with a graphene electrode layer with a top side contact connected to a semiconductor structure via an implanted region in accordance with one or more aspects of the present disclosure.

One or more embodiments or implementations are hereinafter described in conjunction with the drawings, where like reference numerals refer to like elements throughout, and where the various features are not necessarily drawn to scale.

Referring initially to FIGS. 1-10, several exemplary embodiments of a photodetector apparatus are disclosed which may include one or more photo detector cells 2, 32. The disclosed apparatus of these embodiments generally provides a semiconductor structure 6 with an upper surface 6a, along with a thin graphene layer 10 disposed over the upper surface 6a. Graphene is substantially an sp2 bonded carbon layer which is sometimes formed one or more two dimensional honeycomb crystal lattice layers or sheets with a carbon-carbon bond length of about 0.142 nm, where sheets may be stacked with an interplanar spacing of about 0.335 nm, and may be stacked in certain arrangements such as A-B ordering. In certain embodiments, a very thin graphene layer 10 is provided, such as having a thickness of about 3.0 nm or less, where the graphene 10 in certain embodiments may have a thickness of about 0.3 nm or more, and may be a single sheet of carbon atoms forming a substantially two dimensional honeycomb crystal lattice over the upper surface 6a of the semiconductor 6. The graphene layer is substantially an sp2 bonded carbon layer but can have some fraction of carbon atoms with sp3 bonds. The graphene layer can also be thin graphite material such as graphene nanoplatelets. The graphene layer can be nanocarbon structures or nanographene structures with substantially sp2 bonding. The graphene layer may be doped or may be undoped. The graphene layer may have p type or n type conductivity as grown or as transferred, may have p type or n type conductivity by forming a heterojunction with a semiconductor 6, and/or may be doped by intercalating dopants or by adsorbing dopants on the graphene layer surface.

The graphene layer 10 in certain embodiments can be comprised of sheets that are nonplanar (non-parallel) or with respect to surface 6a. The graphene layer 10 can be have high surface roughness and the sheets can be in contact with 6a at contact locations but also have an angle with respect to the surface 6a away from the contact locations. The graphene layer 10, for example, can be rippled, or wavey, or corrugated, have ridges, and other embodiments where the graphene sheets are nonplanar with the semiconductor surface. One approach to form nonplanar few layer graphene sheet material on the surface of semiconductor material 6a is by microwave plasma enhanced chemical vapor deposition as described by N. Soin, et al. *Materials Chemistry and Physics,* 129 (2011), pp. 1051-1057.

In reference to the embodiments of FIGS. 1-6, there can be optional electrical contact to the substrate 4 that makes electrical connection to the semiconductor structure 6. In this regard, the contacts 12, 34 described herein can be in electrical contact (directly or indirectly) with the semiconductor structure 6, but an optional electrical contact (not shown) can also be made to the substrate 4. This would typically be the case if the substrate 4 were conductive silicon carbide or conductive gallium nitride. In such cases, for instance, the contact 12 in FIG. 1 may be to the substrate 4 from the backside (e.g., bottom 2-B) of the substrate 4. If the substrate 4 is a silicon substrate, a conductive nucleation layer and conductive silicon could also be used and electrical contact could be made to the bottom (backside) of the substrate 4. The substrate 4 in certain embodiments can be insulating, semi-insulating, or conductive. For insulating or semi-insulating substrates, the contact 12 can be on the top side 2-T as illustrated in FIG. 1.

The semiconductor structure 6 in certain embodiments may comprise one or more semiconductor layers and especially one or more III-nitride semiconductor layers. The semiconductor structure 6 is generally an epitaxial layer, but need not be an epitaxial layer.

As seen in FIGS. 1-6, moreover, the graphene 10 can be formed in one or more selected areas on the semiconductor structure surface 6a, and other embodiments are possible (e.g., see later figures) in which the graphene 10 can be common between multiple cells.

The apparatus includes a first contact structure 12, 34 electrically connected to the semiconductor structure 6, as well as a second contact structure 14 formed on a portion of an upper surface 10a of the graphene layer 10. FIGS. 1-6 illustrate various embodiments of detector apparatus having top side contacts 12 and 14 for the semiconductor and the graphene electrode layer, respectively. The embodiments of FIGS. 7-10 employ bottom side semiconductor contact structures 34. The photo detector apparatus may be fabricated by any suitable techniques in which a graphene layer 10 is formed (disposed) over the surface 6a of the semiconductor structure 6, and contacts 12 (34) are formed via ohmic and/or Schottky contacts and contact 14 are formed via ohmic contact to the graphene to provide connection with the semiconductor structure 6 and the graphene material 10, respectively, where FIGS. 11-40 illustrate various fabrication examples for bottom side electrically connected embodiments.

As seen in the example of FIG. 1, the photo detector apparatus has a bottom side 2-B and a substrate 4 is provided. An optional epitaxial nucleation or seed layer 5 may be formed on the top side of the substrate 4 for growing one or more epitaxial layers. A p type silicon, silicon carbide (SiC), gallium nitride (GaN), aluminum gallium nitride (AlGaN), indium aluminum nitride (InAlN), aluminum nitride (AlN), gallium arsenide (GaAs), indium phosphide (InP), gallium phosphide (GaP), diamond, zinc oxide (ZnO), boron nitride (BN), magnesium zinc oxide, III-V compound semiconductor, or other p type epitaxial semiconductor layer 6 is then formed over the upper surface of the substrate 4, wherein any optional nucleation layer 5 used to facilitate the formation of one or more epitaxial layers comprising semiconductor layer 6 may be considered as part of the semiconductor layer 6, whereby the semiconductor structure 6 is formed on or over the substrate 4. While illustrated as using a p type semiconductor structure 6, other embodiments are possible in which an n type semiconductor structure 6 is used, wherein the various figures may indicate conductivity type (P or N) via parenthetical indications of nonlimiting contemplated alternate conductivity types in certain cases. The semiconductor layer 6 can be formed to any suitable thickness and dopant concentration, and the embodiment of FIG. 1 also includes a more heavily doped contact region 8. In some embodiments, the semiconductor structure 6 is not formed by epitaxial growth and can be an upper region of the substrate 4 or can be the device layer of a silicon-on-insulator (SOI) substrate.

In accordance with certain aspects of the present disclosure, a graphene layer 10 is formed over an upper surface 6a of the semiconductor layer 6, where the graphene layer 10 can be formed by any suitable processing step(s). For instance, a peel-off/transfer method can be used to form the layer 10 in which a layer is peeled off from a graphite crystal using tape, and transferred to the surface 6a of the semiconductor layer 6. In other possible implementations, a chemical vapor deposition (CVD) process can be used to form the graphene layer 10, for example, in which graphene is formed on a film of metallic catalyst at a temperature of about 450-1000° C., and the graphene is then transferred to the semiconductor 6. In another example, a silicon carbide surface decomposition technique may be used to form the graphene layer 10, in which a silicon carbide semiconductor layer 6 is heat-treated at about 1200-2000° C. to form the graphene material layer 10.

The photodetector apparatus of FIG. 1 also includes a first contact 12, such as a metal structure forming an ohmic contact to the heavily doped (P+) region 8 of the semiconductor, where the contact 12 is laterally spaced from the graphene layer 10 with an optional isolation material 16 (e.g., silicon dioxide or other suitable isolation material) being provided on the lateral sides of the contact structure 12. In addition, a second contact 14, such as a conductive metal is formed on at least a portion of the upper surface 10a of the graphene layer 10, where the isolation material 16 is also formed beneath a portion of the contact 14 in the illustrated embodiments, although not a strict requirement of the present disclosure. Moreover, as seen in FIG. 1, a first portion of the graphene layer 10 is essentially open to receive UV and/or EUV radiation from a top side 2-T of the apparatus in certain embodiments. Alternatively, other embodiments are possible in which the graphene layer 10 may be wholly or partially covered by a material transmissive with respect to the photons wavelength or electron flux energy of interest on the graphene surface in the case of doped graphene to provide air stable doped graphene. It is typically preferable to provide nucleation sites on the graphene surface 10a for the transmissive material to nucleate on the graphene surface by for example forming ionic bonding site or sp3 sites using XeF2 or by making sp3 bonding site on the top graphene sheet using UV ozone or atomic hydrogen. The transmissive material can perform the function of antireflective layer, color filter layer, protective layer, and/or microlens (e.g., see layer 20 in FIGS. 41-47 below).

The graphene layer 10 in certain embodiments can be formed on the semiconductor 6 by epitaxial growth of one or more graphene sheet(s) on the surface 6a. One of the preferred techniques for forming graphene 10 on a semiconductor is to epitaxially grow graphene on an SiC surface 6a at a sufficiently high temperature to desorb silicon atoms from the silicon carbide surface 6a as is known to those skilled in the art. Graphene 10 grown on the silicon face of SiC in certain embodiments forms a single sheet of graphene on the surface of the SiC 6. In certain embodiments, the graphene layer 10 can be as thin as a single atomic layer disposed on the upper surface 6a of the semiconductor 6. In various embodiments, graphene structures 10 of about 3.0 nm or less are used, such as about 0.3 nm or more in thickness in certain embodiments.

As previously mentioned, moreover, the graphene 10 may alternatively be formed by the transfer and bonding of one or more sheets of graphene 10 to the surface 6a of the semiconductor material 6. In the transfer and bond approach, one or more graphene sheets 10 are first grown on a substrate such as SiC, copper, nickel or other known substrates using chemical vapor deposition (CVD), sublimation of silicon as is the case for SiC, or solution growth and by other techniques as are known. In one example of the transfer and bond approach, a heat releasable tape (not shown) is adhered to the top surface of the graphene sheet material that is formed on a substrate, and the heat releasable tape is lifted from the surface of the substrate with graphene material 10 attached to the bottom surface of the heat releasable tape. The surface of the semiconductor material 6 in certain embodiments is suitably prepared for direct bonding of the graphene material layer 10, for example, including appropriate cleaning and in some cases by appropriate treatment for improving the bond strength of the graphene material 10 to the semiconductor surface 6a.

The surface of the graphene material 10 is then brought into direct contact to the surface 6a of the semiconductor material 6 and the bonding forces present between the surface of the graphene material 10 and the semiconductor material 6 such as Van der Waals bonding forces adhere the graphene sheet 10 to the semiconductor 6 (e.g., collector). The bond strength in certain embodiments can be improved by appropriate charging of the semiconductor surface 6a and/or of the graphene sheet(s) 10 by surface exposure to plasma or corona prior to bonding. The graphene/semiconductor bond strength can also be improved in certain embodiments by forming hydroxyl ions (e.g., HO—) on the semiconductor surface 6a. In certain preferred embodiments, electrons (holes) are able to transport across the interface between the graphene 10 and the semiconductor 6. Accordingly, if insulating material such as a native oxide or deposited insulator or grown insulator exists on the semiconductor surface 6a, the insulating material is preferably sufficiently thin enough such that electrons (holes) can transmit from the semiconductor material 6 into the graphene material 10. In this case, the semiconductor surface 6a can be prepared in a suitable manner to minimize the native oxide on the surface in certain embodiments. In addition, the semiconductor surface 6a can also be prepared in certain embodiments to minimize the number of surface states and band bending on the surface 6a. For example, fluorine atoms may be formed on the surface of a GaN semiconductor structure 6 to remove or mitigate band bending at the surface 6a. Other approaches may be employed to reduce surface states and band bending on the semiconductor surface 6a and thus at the semiconductor/graphene interface. In this regard, one preferred material system for the transfer and bond approach is graphene on AlGaN or GaN, wherein the AlGaN or GaN surface 6a is preferably prepared prior to the bonding to remove at least some of the native oxide.

For cases in which a p type graphene layer 10 is used, several methods may be used for its formation. Graphene sheets 10 that are grown on the carbon face of SiC are often p type, for example graphene sheets 10 intercalatated with gold. Graphene 10 grown by CVD on a copper film is typically doped p type, as are graphene sheets 10 grown on the carbon face of silicon carbide. Bromine or FeCl3 intercalation can also be used to dope graphene p type. In other embodiments, n type graphene 10 can be formed by annealing in an ammonia or nitrogen ambient, wherein graphene 10 grown on the silicon face of silicon carbide is typically n type.

Certain embodiments may include an optional tunnel insulator (not shown) between the graphene 10 and the semiconductor surface 6a, where the graphene 10 operates as an electrical electrode to establish a potential on the surface of the semiconductor 6 and to collect photogenerated carriers. The graphene/semiconductor interface in certain embodiments forms a heterojunction that when properly biased allows photogenerated carriers (electrons or holes) within a p type (or n type) semiconductor 6 to transport between the semiconductor material 6 to/from the graphene material layer electrode 10 to create a current from the electrons (holes) flowing in the graphene electrode 10 to a bias supply. The graphene/semiconductor heterojunction can also provide a controlled surface potential on the surface of the semiconductor 6 without a dead layer (the dead layer can prevent the photogenerated carriers from transporting to an appropriate electrode).

Referring to FIGS. 1-6, for the case of an ohmic metal contact 12 to the semiconductor layer 6, a PiN "like" photodiode is established with the graphene/semiconductor heterojunction reverse biased or approximately zero biased. For embodiments using a Schottky metal contact 12 to the semiconductor 6, the heterojunction is reverse biased and the Schottky metal/semiconductor junction is forward biased.

One particular advantage of using graphene 10 on the semiconductor surface 6a as an electrode of the UV/EUV photodetector cell 2 is that the graphene 10 can be very thin (e.g., as thin as a single atomic sheet of graphene in certain embodiments) and graphene material 10 absorbs only a small percentage of the incident light. For example, a single graphene sheet 10 theoretically absorbs only about 2.3 percent of the incident light, whereby approximately 97 percent of the UV/EUV light will be absorbed in the semiconductor 6. EUV light in particular has a 1/e absorption depth of approximately 4 nm at 270 nm and less than approximately 10 nm at alpha lyman wavelength of the semiconductor structure 6 in certain embodiments, and a single graphene sheet 10 is approximately 0.3 nm thick. Consequently, a high percentage of the EUV light can transit through the graphene 10 into the semiconductor 6 without being absorbed in the graphene 10.

The graphene electrode 10 in certain embodiments can be one or more graphene sheets but is preferably one sheet of graphene 10 for application as an electrode for the detector apparatus, wherein the sheet resistance of a single graphene sheet 10 is approximately 750 □/square and the sheet resistance of 4 sheets of graphene is approximately 100-300 ohms/square.

The semiconductor material 6 in certain embodiments can be one or more layers of silicon carbide, gallium nitride, aluminum gallium nitride, indium aluminum nitride, aluminum nitride, silicon, gallium arsenide, indium phosphide, diamond, zinc oxide, boron nitride, magnesium zinc oxide, III-V compound semiconductor, and other appropriate material known to those of ordinary skill in the art. The semiconductor material 6 in certain embodiments can be selected based on properties such as bandgap energy, absorption coefficient at the wavelength(s) of interest, surface state density, material defects, photocarrier recombination lifetime, whether the surface has positive or negative fixed charge, electron-hole generation lifetime, etc., where the semiconductor material bandgap is often an important consideration.

One operational criterion for detecting UV/EUV is that the UV/EUV detector is preferably solar blind. In certain embodiments, therefore, the UV/EUV photodetector is generally not responsive to light with wavelengths longer than approximately 280 nm. In this regard, one particularly suitable semiconductor material 6 to implement a solar blind UV or EUV detector is AlGaN with a bandgap of approximately 4.2 eV. Other semiconductor materials 6 such as InAlN are also appropriate for a solar blind EUV detector. The AlGaN and InAlN semiconductor materials 6 are often formed by epitaxial growth of AlGaN or AlInN on a GaN epitaxial layer or GaN/AlGaN, or GaN/AlN epitaxial layer grown on a substrate such as a silicon, silicon carbide, sapphire, or AlN substrate.

Another criterion for choosing the semiconductor material 6 is to have a wide bandgap to facilitate low generation lifetime and thus a low leakage current. Silicon carbide, gallium nitride, indium aluminum nitride, aluminum gallium nitride, and diamond are wide bandgap materials with low generation lifetime and thus low leakage current. Other wide bandgap materials that can implement UV or EUV detectors include diamond, boron nitride, and zinc oxide. The bandgap of 3C—SiC is about 2.6 eV. The bandgap of 6H—SiC is about 3.03 eV. The bandgap of 4H—SiC is about 3.2 eV. The bandgap of gallium nitride is about 3.4 eV. The bandgap of aluminum gallium nitride varies as the percentage of aluminum in the compound semiconductor. The bandgap of AlGaN with an aluminum concentration of about 40 percent is about 4 eV. Another consideration is provision of a passivation layer with low surface state density on the semiconductor surface 6a so that there is a low leakage current. Also, it is preferred that there not be dead layers formed within the photodetector that can impede the transport of photogenerated carriers to the graphene electrode 10. Moreover, as discussed above, the graphene 10 preferably forms a low leakage junction (heterojunction) with the semiconductor material 6, particularly where there is an electrical bias established between the graphene electrode 10 and the semiconductor material 6.

In operation, a bias voltage may be applied between the graphene material electrode 10 and the semiconductor material 6 via the electrical contacts 12 and 14. However, a reverse bias is preferably established between the graphene 10 and the semiconductor 6. For a p type (n type) semiconductor structure 6, a positive voltage can be applied to the graphene 10 relative to the semiconductor bias to create a depletion layer in the semiconductor 6 and to accelerate photogenerated electrons toward the graphene 10 and to accelerate photogenerated holes into the semiconductor material 6. For some operation conditions, a zero bias may be applied between electrical contacts 12 and 14. For an n type semiconductor 6, a negative voltage can be applied to the graphene 10 relative to the semiconductor 6 in order to create a depletion layer in the semiconductor 6 and accelerate photogenerated holes toward the graphene 10 and photogenerated electrons into the semiconductor material 6. The graphene material on semiconductor structure in certain embodiments can provide a rectifying contact that allows the application of a reverse bias between the graphene 10 and the semiconductor 6.

The offset in potential of the conduction band minimum of the emitter region material or collector region material and the conduction band minimum of the base graphene material layer 10 can be estimated by using the difference in electron affinity of the two material systems. Table I below shows the estimated conduction band offset between graphene 10 and a semiconductor 6 estimated from the electron affinity difference.

TABLE I

Electron Affinity

| Material | Electron Affinity | Conduction Band Offset from Graphene |
|---|---|---|
| Graphene | 4.5 eV | |
| CdSe | 4.95 eV | −0.45 eV |
| InAs | 4.9 eV | −0.4 eV |
| SnO2:F | 4.8 eV | −0.3 eV |
| InSb | 4.59 eV | −0.09 |
| ZnO | 4.5 eV or 4.35 | 0.0 eV or 0.15 eV |
| BN | 4.5 eV | 0.0 eV |
| CdTe | 4.5 eV | 0.0 eV |
| CdS | 4.5 eV | 0.0 eV |
| In2O3:Sn | 4.5 eV | 0.0 eV |
| InGaN | 4.1-4.59 eV | −0.4 eV |
| InAsP | 4.38 to 4.9 eV | −0.4 to 0.12 eV |
| InP | 4.38 eV | 0.12 eV |
| InGaAs | 4.1 to 4.9 eV | −0.4 to 0.4 eV |
| InAlAs | 4.1 to 4.9 eV | −0.4 to 0.4 eV |
| InGaSb | 4.1 to 4.59 eV | −0.09 to 0.4 eV |
| InN | 5.8 eV | −1.3 eV |
| Diamond | 4.2-4.5 eV | 0.0 to 0.3 eV |
| GaN | 4.1 eV or 4.3 eV | 0.2 or 0.4 eV |
| GaAs | 4.07 eV | 0.43 eV |
| Silicon | 4.05 eV or 4.29 | 0.45 eV |
| 4H-SiC | 4.05 eV | 0.45 eV |
| GaSb | 4.05 eV | 0.45 eV |
| Germanium | 4.0 eV | 0.5 eV |
| AlP | 3.98 eV | 0.52 eV |
| ZnS | 3.9 eV | 0.6 eV |
| GaP | 3.8 eV | 0.7 eV |
| AlSb | 3.65 | 0.85 eV |
| AlAs | 3.5 eV | 1.0 eV |
| AlN | 0.6 eV | 3.9 eV |

In the case of a graphene material layer heterojunction with silicon carbide for graphene 10 formed on 4H silicon carbide material 6, the estimated conduction band offset is approximately 0.45 eV. Since the bandgap of such semiconductor 6 is 3.26 eV, and the estimated valance band offset between graphene and the SiC valance band is approximately 2.81 eV. The graphene on silicon carbide can thus be approximately treated as a Schottky or Schottky "like" junction with approximately a 0.45 barrier for electron injection from the graphene 10 into the 4H silicon carbide semiconductor 6 or a 2.81 eV barrier for injection of holes from the graphene 10 into the semiconductor 6. These barrier heights can be different than the simple estimate above when traps are provided at the graphene material/semiconductor interface, and/or when image potential and other mechanisms are taken into account. There will be different potential barrier values, moreover, for other semiconductor materials 6. The barrier height between the graphene and the semiconductor material 6 can be changed by absorbing atoms or molecules on the graphene surface or by intercalating dopant between the graphene sheets forming the graphene layer 10 or between the graphene sheet and the semiconductor. One method of doping graphene is to intercalate dopant atoms between the graphene sheets. For example, intercalating graphene layer 10 with bromine atoms, FeCl3 molecules, or other dopant atoms or molecules will generate a p type doped in graphene. The p type doping of graphene will generate a larger barrier height for graphene on n type semiconductor 6 and the higher barrier height will typically lead to lower leakage currents. Phosphorous, NH3 and other dopants can be used to dope graphene n type. It is useful to select the dopant atoms for temperature and air exposure stability in graphene so that the device will not be degrade for high processing temperatures or high operating temperature. For example, bromine is stable in graphene for temperatures greater than 200 C and will continue to dope graphene for temperature greater than 300 C. The graphene layer 10 can optionally be capped with a thin atomic layer deposited oxide for improved air stability.

In certain embodiments, a low leakage reverse bias graphene material to 4H silicon carbide junction can be formed for p type 4H—SiC semiconductor material 6, in which a large positive voltage can be applied to the graphene electrode 10 relative to the semiconductor 6 and still have low leakage current. This is consistent with the large potential barrier for hole injection from the graphene 10 into p type 4H silicon carbide 6. For the case of graphene material on an n type 4H silicon carbide semiconductor 6, the leakage current is higher and this is also consistent with there being a smaller potential barrier for electron injection from the graphene 10 into an n type 4H—SiC 6.

In the case of graphene 10 on a p type 4H silicon carbide 6, a very large reverse bias can be applied, and thus there is the potential for avalanche gain for photogenerated carrier in the depletion layer in the semiconductor 6. As a result, an avalanche graphene on semiconductor UV or EUV photodetector 2 is possible. Moreover, certain embodiments may include a thin oxide material layer (not shown in the figures) between the graphene material 10 and the semiconductor material 6. In this case, such an oxide material is preferably sufficiently thin so as to not impede the flow of photogenerated current to the graphene material electrode 10 (e.g., the thin oxide may be a tunnel insulator). The thin oxide layer can in some cases advantageously reduce leakage current, and in certain embodiments may be a native oxide on the semiconductor surface 6a when a graphene material 10 is transferred and bonded to a semiconductor 6, or can be formed from the growth of graphene material 10 on the surface 6a of the semiconductor material 6.

As seen in the example of FIG. 1, the graphene material electrode 10 is on the front or top surface 6a of the semiconductor structure 6 and includes an exposed first portion able to receive UV/EUV illumination into the top surface 6a of the semiconductor layer 6. FIGS. 1-6 show top contacted embodiments, and FIGS. 7-10 illustrate bottom-contacted embodiments with respect to the connection for the semiconductor material 6. In certain embodiments, moreover, ohmic metal contacts 12 are provided for connection to the semiconductor 6 (e.g., FIGS. 1, 2, 4, 5, 7 and 9), whereas Schottky metal contacts 12 can be used for connection to the semiconductor layer in other embodiments (e.g., FIGS. 6, 8 and 10). Moreover, certain embodiments may include mechanical support structures 4, 40 such as support substrate features, where etched mechanical support substrates may be provided on the backside and/or etched mechanical support substrate wafers may be bonded to top and/or bottom sides of semiconductor 6 in various embodiments.

Figure 2:
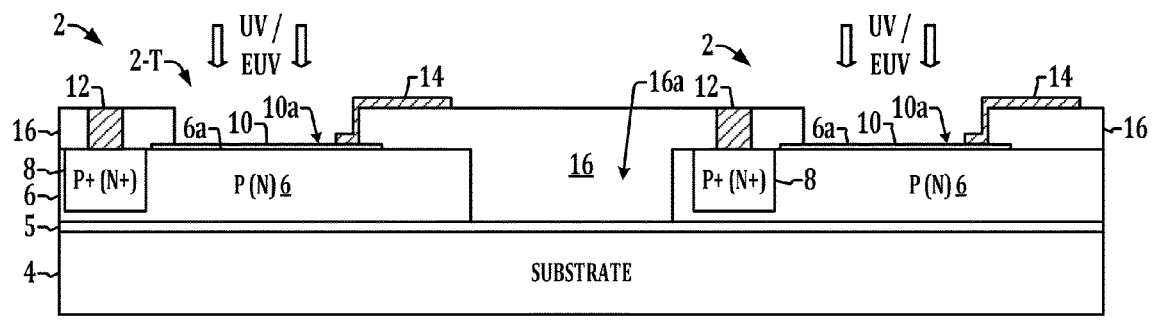
FIG. 2 is a partial sectional side elevation view illustrating two cells and an intervening isolation structure in the apparatus of FIG. 1.
Figure 3:
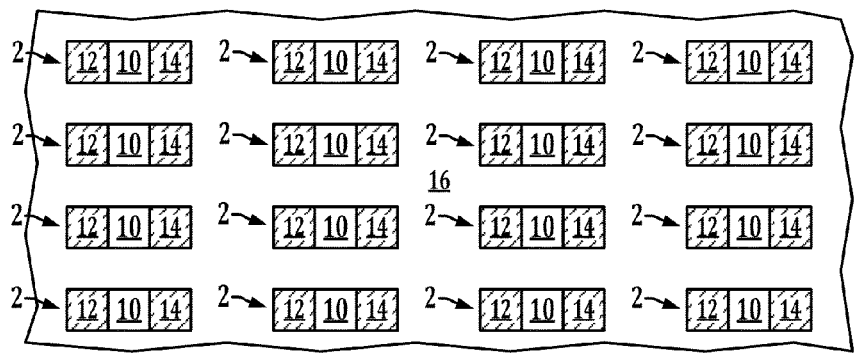
FIG. 3 is a partial top plan view illustrating an array of detector cells in the apparatus of FIGS. 1 and 2.

As seen in FIGS. 2 and 3, moreover, the photodetector apparatus may include a plurality of detector cells 2, each having an associated exposed portion of the graphene layer 10 and associated contacts 12 and 14, with one or more isolation structures 16 separating two or more of the detector cells 2 from one another. FIG. 2 shows a side view of two exemplary cells 2 and an intervening isolation structure 16 in the apparatus of FIG. 1, and FIG. 3 provides a top view showing an array of detector cells 2 in the apparatus of FIGS. 1 and 2. Isolation between laterally adjacent photodetector cells 2 can be provided by a variety of techniques. In one embodiment, deep level ion implantation can be used to create a semi-insulating layer (e.g., optional isolation implants 7 in FIGS. 7 and 8), or isolation can be provided by formation of opposite dopant in the isolation region (e.g., regions 38 in FIGS. 9 and 10). In other embodiments, epitaxial regrowth can be used in the isolation region, as well as selective epitaxial growth of photodetector epitaxial layers with separation between epitaxial layers, photoelectrochemical etched trenches, or reactive ion etching (RIE) can be used to create etched trenches in the isolation region 16. Also doping concentration incorporated at the front or back surface can be used to prevent or mitigate creation of an inversion layer at the front or back surfaces. In certain embodiments, electrodes or contacts 12 may optionally or preferably be connected to a common electrode or connected to the substrate 4. The embodiment in FIGS. 2 and 3 shows a two dimensional array. A linear array with a common 12 electrode is an alternate embodiment.

Ohmic metal contacts for the semiconductor connection 12 generally incorporate a heavily doped region (e.g., region 8 in FIGS. 1 and 2) with a higher dopant concentration than the remainder of the semiconductor structure 6 in order to achieve ohmic contact via the metal 12. In certain embodiments, moreover, the metal contact can be alloyed, although alloyed and non-alloyed embodiments are possible. For example, an ohmic contact 12 can be made without annealing at high temperatures, i.e., non-alloyed contacts. Schottky metal contacts 12 (e.g., FIGS. 6, 8 and 10) in certain embodiments can be made to low dopant concentration regions of the semiconductor surface 6a. The Schottky metal contact 12 can be naturally isolated if there is no surface inversion, 2 DEG, or 2 DHG conduction between laterally separated photodiode pixels.

Figure 4:
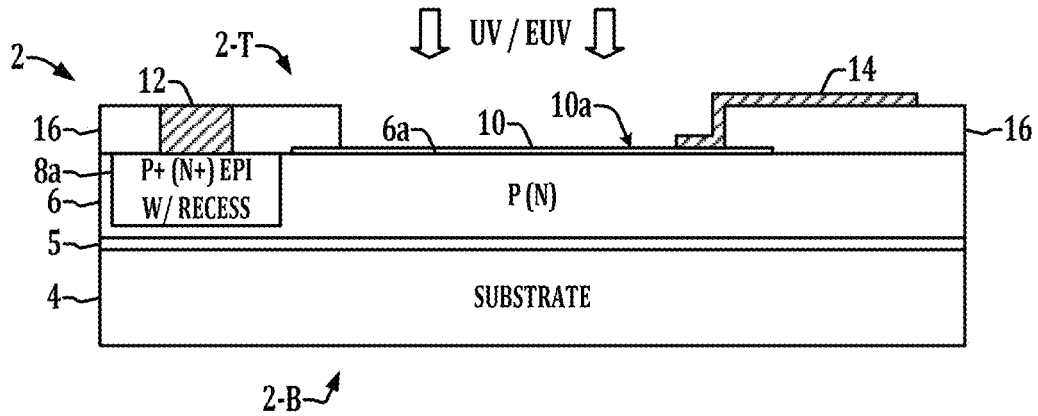
FIG. 4 is a partial sectional side elevation view showing another UV or EUV detector embodiment with a top side contact connected to the semiconductor structure via an epitaxial region.
Figure 5:
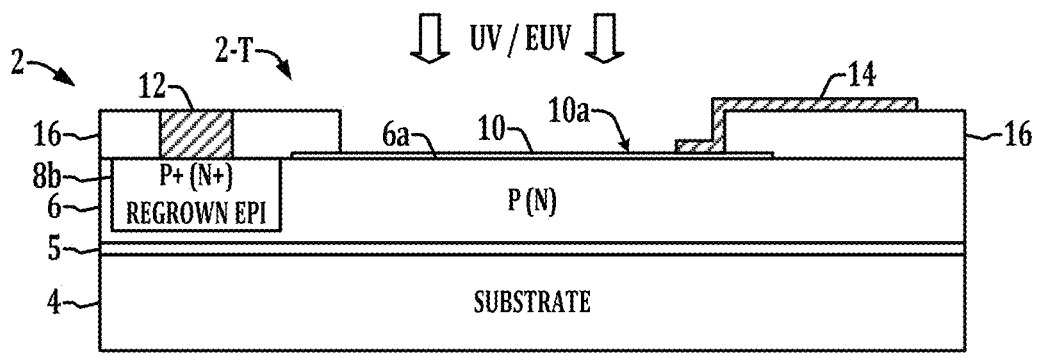
FIG. 5 is a partial sectional side elevation view illustrating another detector embodiment with a top side contact connected to the semiconductor structure via a regrown epitaxial region.
Figure 6:
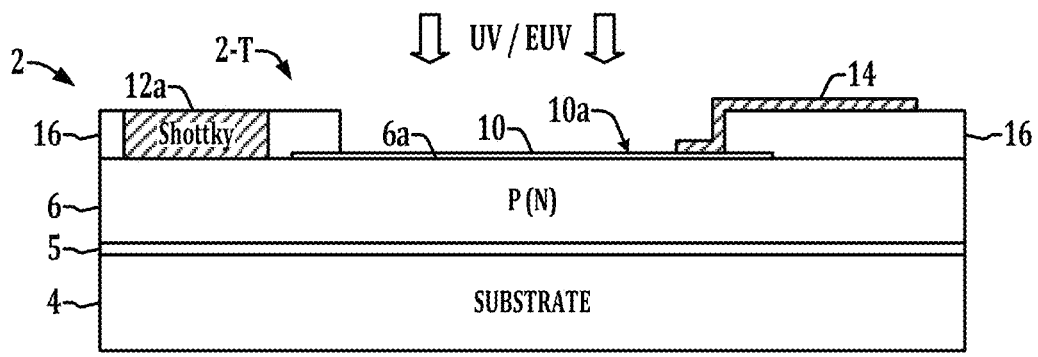
FIG. 6 is a partial sectional side elevation view illustrating another detector embodiment with a top side Schottky contact connected to the semiconductor structure.

FIG. 1 illustrates a single cell 2 of a UV or EUV detector apparatus with a graphene electrode layer 10 having a top side first contact 12 connected to a semiconductor structure 6 via an implanted region 8. In the example of FIG. 4, the detector cell includes a top side contact 12 connected to the semiconductor structure 6 via an epitaxial region 8a formed within a recess in the semiconductor 6. FIG. 5 shows a detector cell embodiment 2 with a top side contact 12 connected to the semiconductor structure 6 via a re-grown epitaxial region 8b. FIG. 6 shows another detector cell embodiment 2 with a top side Schottky contact 12a connected to the semiconductor structure 6 without the use of a highly doped region. The recess in FIG. 4 is optional.

Figure 7:
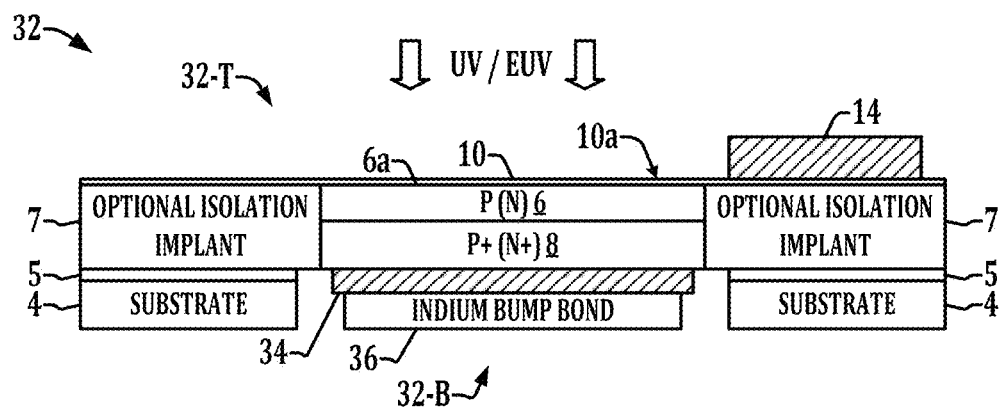
FIG. 7 is a partial sectional side elevation view illustrating a UV or EUV detector apparatus with a thin graphene electrode layer and a top side graphene contact, as well as a bottom side contact connected to a heavily doped implanted region of a semiconductor structure, with deep level trap isolation regions.
Figure 8:
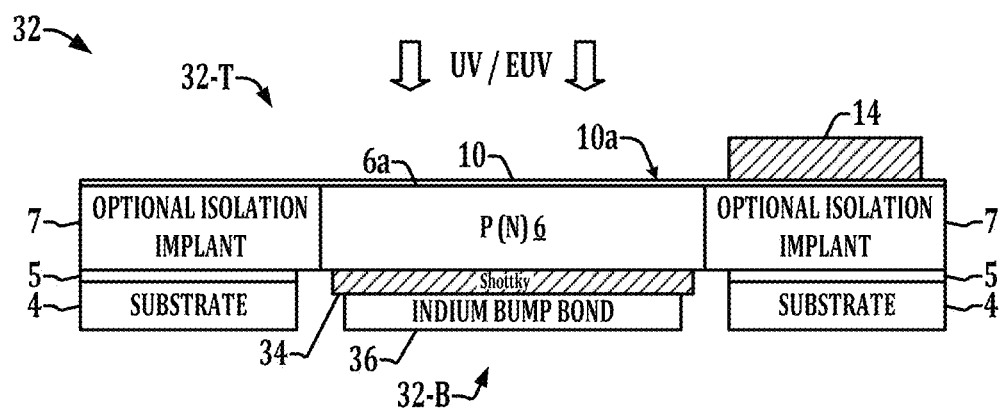
FIG. 8 is a partial sectional side elevation view illustrating another bottom side contacted detector embodiment with a Schottky metal contact connected to a lower side of the semiconductor structure, along with deep level trap isolation regions.
Figure 9:
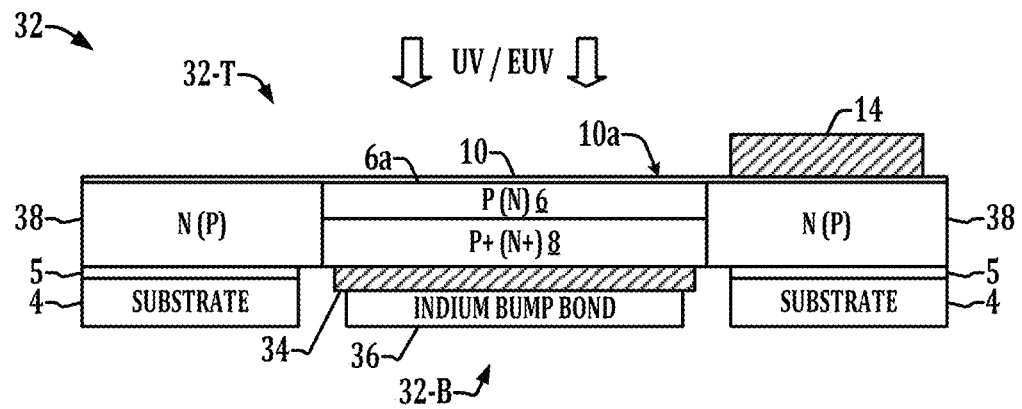
FIG. 9 is a partial sectional side elevation view illustrating a UV or EUV detector apparatus with a thin graphene electrode layer and a top side graphene contact, as well as a bottom side ohmic metal contact connected to a heavily doped implanted region of a semiconductor structure, with oppositely doped isolation regions.
Figure 10:
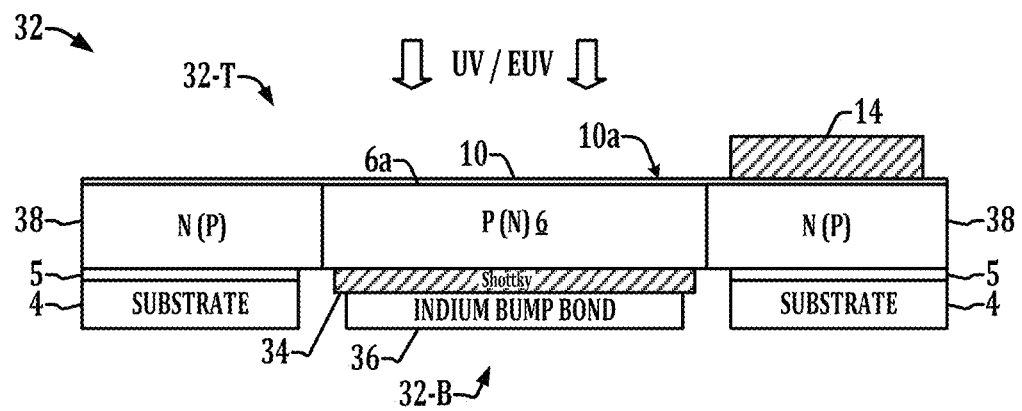
FIG. 10 is a partial sectional side elevation view illustrating another bottom side contacted detector embodiment with a bottom side Schottky metal contact connected to a lower side of the semiconductor structure, along with oppositely doped isolation regions.

Backside contacted examples are shown in FIGS. 7-10, in which the example of FIG. 7 includes a detector cell 32 having a thin graphene electrode layer 10 and a top side contact 14 connected to the graphene upper surface 10a along a top side 32-T of the apparatus, as well as a bottom side contact 34 and an optional underlying indium bump bond 36 connected along the bottom side 32-B to a heavily doped implanted region 8 of the semiconductor structure 6, with deep level trap isolation regions 7 formed for cell-cell isolation. FIG. 8 shows an alternate embodiment in which a bottom side Schottky metal contact 34 is connected to a lower side of the semiconductor structure 6, along with deep level trap isolation regions 7. Another possible embodiment is shown in FIG. 9, with a thin graphene electrode layer 10 and a top side graphene contact 14, as well as a bottom side ohmic contact 12 connected to a heavily doped implanted region 8 of a semiconductor structure 6, with n doped isolation regions 38. In addition, FIG. 10 illustrates another bottom side contacted detector cell example 32 having a bottom side Schottky metal contact 34 for connection to the semiconductor structure 6, along with oppositely doped n type isolation regions 38.

Figure 16:
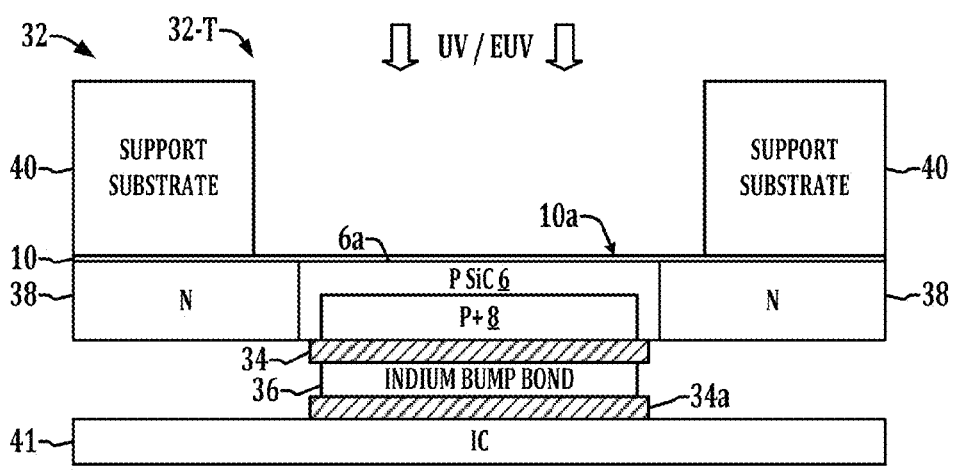

As shown in the bottom side contacted cells 32 of FIGS. 7-10, for example, various embodiments may include mechanical support structures 4 such as substrates or portions thereof. Such support structures may be provided on either or both of the top or bottom sides of the semiconductor structure 6 (e.g., support substrate structures 40 shown in FIGS. 16, 22, 28, 34 and 40), and can be formed by a variety of techniques. In certain embodiments, for example, a mechanical support substrate is attached in selected locations to provide mechanical support to the semiconductor layer 6. For example, a top side mechanical support substrate 40 can be recessed (e.g., etched, as seen in FIG. 16 below) in selected regions to the surface of the semiconductor layer 6 or to the surface of the graphene material layer 10 to allow UV/EUV light to illuminate the semiconductor layer and create photocarriers in the semiconductor layer 6. In one possible configuration, ribs of the mechanical support substrate, which remain attached to the semiconductor layer 6 to provide mechanical support.

The mechanical support substrate 4 in FIGS. 7-10 and/or the support substrates 40 in FIGS. 16, 22, 28, 34, and 40 may be constructed using a variety of techniques. For instance, a top side support structure 40 (e.g., FIGS. 16, 22, 28, 34, and 40) can be created by wafer bonding a support substrate 40 to the graphene material layer surface 10a, optionally using a material layer (not shown) that is deposited on the graphene surface and then CMP polished to facilitate wafer bonding or alternatively polymer layers, adhesive layers, spin-on-glass (SOG), metal layers, etc. to facilitate bonding of the support substrate 40 to the semiconductor layer 6 and/or to the graphene layer 10. Another possible technique for a top side support substrate 40 can include III-Nitride layers grown on a substrate that is not a III-Nitride material. The substrate 40 can be etched in selected locations recessed in selected regions to the surface of the III-Nitride semiconductor layer surface to allow UV/EUV light to illuminate the graphene 10 to create photocarriers in the semiconductor layer 6. As seen in the FIGS. 16, 22, 28, 34, and 40 below, ribs of the mechanical support substrate 40 remain attached to the semiconductor layer 6 and/or to second portions of the graphene 10 so that mechanical support is provided to the semiconductor layer 6. The recesses in the support substrate 40 can be implemented in certain embodiments by smart cut processing and/or by etching or Laser Ablation substrate removal.

Moreover, isolation by deep level ion implantation, opposite dopant to semiconductor layer, and/or trenches with included doped structures can be used to prevent inversion layer at the front or back surfaces for separating photodetector cells (individual pixels) 2, 32 from one another. FIG. 2 illustrates an exemplary apparatus with two illustrated photodetector cells 2 in which an isolation material 16 is provided in a trench 16a. A bottom contacted apparatus (e.g., FIGS. 7-10)

may provide cell-cell isolation by implantation of opposite dopants as an epitaxial layer in the isolation regions, or by formation of a p well (or n well) for the photodetector region by ion implantation or diffusion in background n type (p type) epitaxial material. In other embodiments, a trench is etched, for example, using reactive ion etching (RIE), ICP etching, or ion mill etching, together with trench sidewall passivation. Such a trench can also be formed by photoelectrochemical etching between laterally separated photodiode pixels. The isolation structures can be provided by selective epitaxial growth of laterally separated p type (n type regions) and/or by implantation of deep level traps to implement a semi-insulating layer or implanting a high surface dopant concentration to prevent or inhibit inversion layer formation. Isolation between laterally separated photodetector pixels or cells 2, 32 can thus be provided by incorporating doped regions at the surface in the semiconductor layer, thick dielectric between photodetector pixels, potential barriers made by photodefined III-nitride material layers or some other material(s) that prevents or mitigates surface inversion conduction, two dimensional electron gas, or two dimensional hole gaps between laterally separated photodetector pixels 2, 32.

Referring again to FIGS. 1-3, the detector apparatus of FIG. 1 provides a topside illuminated, topside contacted detector structure including one or more cells 2 with an implanted p+ (n+) alloyed or non-alloyed ohmic metal contact structure 8, 12 for connection to the semiconductor 6, where the dopant concentration of the region 8 is higher than that of the remainder of the semiconductor structure 6. In this example, an ion implantation is performed using a corresponding implantation mask (not shown) to provide high dopant concentration in the region 8 for ohmic contact, and the implantation may be followed by an anneal to activate the implanted dopant. A graphene material layer 10 is either epitaxially grown on the semiconductor structure 6 (e.g., silicon carbide or other semiconductor type), or the graphene 10 may be grown at the interface of a metal such as nickel and a semiconductor layer surface. A photostep is performed to mask the graphene material layer so that the graphene material layer is removed (etched) outside of the defined area, and an optional passivation dielectric (e.g., dielectric 16) may be deposited. A photostep is performed to form ohmic metal 12 on the implanted region 8, and optional alloy annealing may be performed. A photostep is then performed to define the ohmic metal 14 for connection to the graphene layer 10.

FIG. 4 illustrates another embodiment in which one or more cells 2 are illuminated from the top side 2-T, and the contacts are formed on the top side 2-T. In this example, an epitaxial p+ (n+) region 8a is formed within an etched recess for ohmic connection with an alloyed or non-alloyed ohmic metal contact 12 for connection to the semiconductor structure 6. In one possible implementation, the p+ (n+) epitaxial layer 8a is grown on the surface 6a of the semiconductor layer 6, and a recess etch process is performed to etch through the p+(n+) layer 8a. A graphene material layer 10 is epitaxially grown on the recess etched substrate 6/8a or is transferred and bonded thereto, where the graphene 10 preferably conforms to the semiconductor surface/recess etched surface and good bonding preferably occurs between the graphene 10 and the recess etched semiconductor layer. Optional passivation dielectric 16 may be deposited, and a photostep is performed to form ohmic metal 12 on the high dopant concentration p+ (n+) layer 8a. An alloy anneal step may be performed, and a photostep is performed to define the ohmic metal 14 to connect to the graphene material layer 10.

FIG. 5 illustrates another detector embodiment with a top side alloyed or non-alloyed ohmic metal contact 12 connected to the semiconductor structure 6 via a regrown epitaxial region 8b. In this case, graphene 10 is formed and patterned on the semiconductor 6, and thereafter a high dopant concentration p+ (n+) epitaxial layer 8b is selectively grown in openings in a dielectric (e.g., dielectric 16 in one example). An optional passivation dielectric may be formed, and a photostep is performed to form ohmic metal 12 on the implanted region 8b. Alloy annealing may be performed as needed, and a photostep is performed to define the ohmic metal 14 connection to the graphene layer 10.

FIG. 6 shows another detector embodiment with a top side Schottky metal contact 12a connected to the semiconductor structure 6. For the case of a Schottky metal contact 12a, no highly doped region is needed as was the case in FIGS. 4 and 5 above, wherein this embodiment may be fabricated using the processing described above except that it is not necessary to form an ion implanted p+ (n+) layer in the semiconductor 6.

In certain top side contacted embodiments, moreover, a non-alloyed contact can be made to the nitrogen-face of III-Nitride epitaxial layers or to a high dopant concentration region.

FIGS. 7-10 illustrate bottom side contacted examples, in which the connection to the graphene material layer 10 is provided by a topside contact structure 14, with the connection to the semiconductor structure 6 being provided by a bottom side contact 34, and an optional indium bump bond 36 may be formed on a lower side of the bottom contact 34. One or more support substrate structures 4 may be provided on the bottom side 32-B of the apparatus. In addition, cell-cell isolation may be provided by implanted isolation region 7 (FIGS. 7 and 8) and/or by oppositely doped isolation regions 38 (FIGS. 9 and 10) in certain non-limiting embodiments.

In certain embodiments, the apparatus includes one or more photodetector cells 32, and a III-nitride epitaxial layer can be grown on a substrate, such as silicon, where the III-nitride epitaxial layers can be grown so that a p+ (n+) epitaxial layer is at the bottom surface (surface closest to the substrate) of the III-nitride epitaxial layer that will aid in facilitating ohmic contact. One approach to achieve electrical isolation between laterally separated UV/EUV photodetector pixels or cells 32 is to perform an ion implantation of atoms such as protons or oxygen that create deep level traps (regions 7 in FIGS. 7 and 8).

In the example of FIG. 7, a graphene material layer 10 is formed on the surface of the III-Nitride epitaxial layer, for example by transferring and bonding a graphene layer 10 formed on a metal surface to the surface of the III-nitride material. The graphene 10 may also be formed on the surface of the III-nitride material by depositing a metal such as nickel or iron on the III-nitride surface, forming a carbon material that precipitates into the metal by exposure to methane or by ion implanting carbon into the metal, and then rapidly cooling to have the nickel precipitate out of the interior of the metal to the interface between the metal and the III-nitride semiconductor. An optional temporary support substrate or wafer 4 can be attached to the structure to provide additional mechanic support during the indium bump processing. The mechanical support substrate 4 on the bottom side can then be etched to the III-nitride material in selected locations, leaving a grid of the substrate remaining in the regions between the laterally separated photodetector pixels 32. The exposed III-nitride nucleation layer 5 is then etched, and an ohmic metal 34 is deposited which contacts the p+ (n+) III-nitride material 8, followed by optional alloy annealing. A non-alloy ohmic contact 34 may be used to connect to the bottom surface of the III-nitride material, which is preferably a nitrogen-face material 8, and an indium bump bond structure 36 is formed on the lower surface of the ohmic metal 34. The structure may then be optionally bonded to a readout integrated circuit (not shown in FIG. 7), and any optional temporary handling wafer may be removed.

FIG. 8 shows an alternate embodiment using a Schottky metal contact 34, in which cases there are no p+ (n+) highly doped regions at the bottom side of the semiconductor 6, whereby a Schottky contact 34 can be formed to the bottom surface of the semiconductor 6.

Referring also to FIGS. 9 and 10, FIG. 9 shows another photodetector apparatus with a thin graphene electrode layer 10 and a top side graphene contact 14, as well as a bottom side contact 34 connected to a heavily doped implanted region 8 of a semiconductor structure 6, with oppositely doped isolation regions 38. Fabrication of the embodiment of FIG. 9 is generally similar to that of FIG. 7 above, except that the isolation between laterally separated detector cells 32 is provided via n type doped regions 38 (oppositely doped relative to the conductivity type of the remainder of the semiconductor structures 6). The oppositely doped regions 38 in certain embodiments can be provided via a trench, or epitaxially regrown n type (p type) material. The n type (p type) doped region(s) 38 can be made in certain embodiments by implantation of n (p) type dopants, or alternatively by implantation and optional diffusion to form an p-well (n-well) in the III-nitride material layers that are oppositely doped (n type (p type)), not shown. The regions 38 can also be made by etching p type (n type) material to form trenches and then epitaxially regrowing n type (p type) material in the etched trenches, followed by chemical mechanical polishing (CMP) or other material removal processing. Trench isolation can be performed by reactive ion etching (RIE) or alternately photoelectrochemical etching. Photoelectrochemical etching will have the least material damage and may result in the lowest leakage current in certain implementations. An alternate isolation approach is to selectively grow p type regions 38 with narrow separation from adjacent p type (n type) regions 6 on an AlN nucleation layer 5 on a silicon substrate 6. Trench regions can be filled with oxide and then a metal layer can be deposited to connect the graphene 10 on top of each of the p type (n type) III-Nitride regions to the graphene material layer in adjacent p type (n type) III-Nitride material regions, with the remainder of the fabrication processing being similar to that of FIG. 7 above.

FIG. 10 illustrates another bottom side contacted detector embodiment with a bottom side Schottky metal contact 34 connected to a lower side of the semiconductor structure 6, along with oppositely doped isolation regions 38. This embodiment may also include lower support substrate structures 4 formed by selected etching. This embodiment may be created using the above described processing associated with the example of FIG. 9, except that no high dopant concentration region 8 need be formed.

Figure 11:
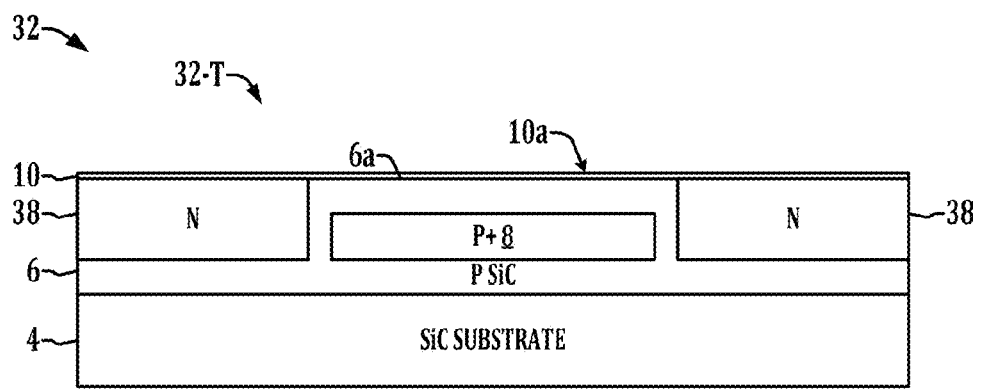
FIGS. 11-16 are partial sectional side elevation views illustrating fabrication of a bottom side contacted detector similar to that and FIG. 7.

Referring now to FIGS. 11-16, graphene 10 in certain embodiments is formed on a silicon carbide semiconductor structure 6, and nitrogen is implanted to form trenches for isolation, with optional retrograde aluminum boron implantation for ohmic contacting with high temperature annealing and hydrogen implantation for smart cut processing. Smart cut processing may be used in certain embodiments to manufacture various bottom side contacted embodiments as described further hereinafter. This approach involves splitting a surface semiconductor layer from a substrate by a hydrogen ion implant (or a hydrogen ion implant in combination with a helium implant) followed by annealing to cause hydrogen gas pressure buildup that causes crystal lattice splitting. Alternately, a water jet impinging on the implanted region from the side of the wafer or a knife-edge incident on the implant layer can split a surface semiconductor layer from the semiconductor substrate. In the Smart Cut approach, an optional retrograde p+ (n+) ion implant is made through a graphene layer 10 into a p type (n type) semiconductor epitaxial layer to a selected depth so that the surface of the p type (n type) semiconductor epitaxial layer remains p type (n type). Typical p type semiconductor materials include p type SiC, GaN, AlGaN, AlN, InAlN, InGaAlN, MgZnO, and ZnO. An anneal may thereafter be performed to activate the optional p type retrograde ion implant. A hydrogen ion implant (or hydrogen+helium ion implant) may then be performed so that the peak of the implant is at a depth that is at approximately a middle depth of the retrograde p type ion implant. FIG. 11 illustrates the device after hydrogen implantation and retrograde aluminum or boron implantation, where the isolation regions 38 have been formed by implantation of n type dopants into an etched trench.

Figure 12:
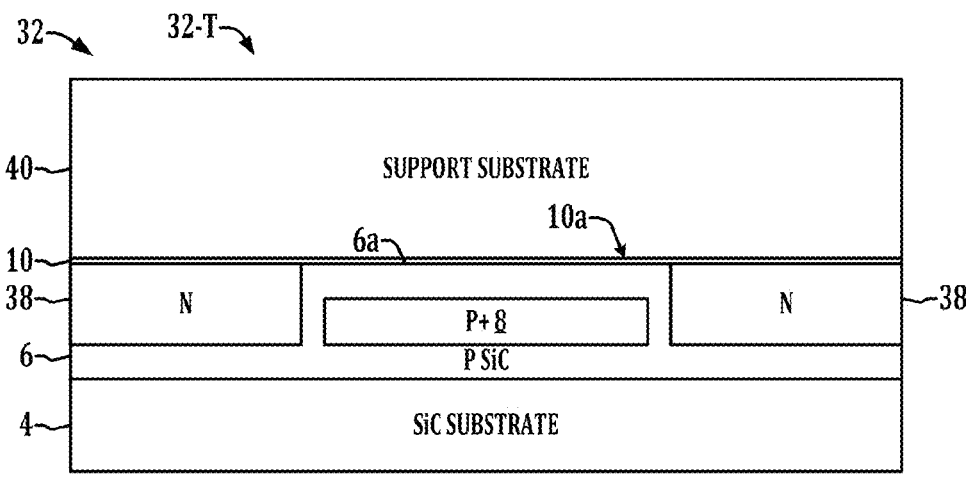
Figure 13:
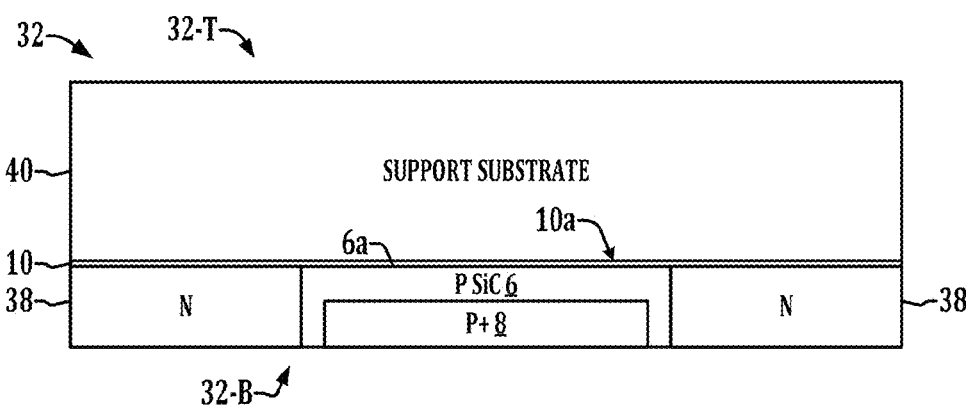

As seen in FIG. 12, the top surface of the p type (n type) semiconductor epitaxial layer surface is then wafer bonded to a support substrate such as a silicon substrate 40. There can be materials on the upper graphene surface 10a such as plasma enhanced CVD (PECVD) silicon oxide that is CMP polished to facilitate wafer bonding. The silicon/SiC pair is then heated to cause the SiC substrate to split at the depth of the location of the hydrogen ion implant as shown in FIG. 13. An optional CMP polish, oxidation step, or anneal process can be performed to reduce any damage at the smart cut surface.

The Smart Cut process is particularly advantageous for separating a SiC epitaxial layer from a SiC substrate since it is very difficult to achieve a thin single-crystal silicon carbide layer by other processes. The Smart Cut process can also be used for AlGaN or GaN epitaxial layers on a substrate, particularly for silicon substrates. The Smart Cut ion implant can be performed so that the semiconductor splitting occurs within the AlGaN or GaN epitaxial layer materials or the hydrogen ion implant can be performed so that the semiconductor splitting occurs within the silicon substrate. The silicon substrate can then be etched back to the AlN nucleation layer, the AlN nucleation layer can be etched, after which further etching into the AlGaN or GaN epitaxial layer can be performed if desired.

Isolation between laterally adjacent detector cells 32, assuming a p type (n type) semiconductor layer 6, can be obtained by ion implant of an n type (p type) dopant layer, etching a trench and passivating side walls of the trench, ion implanting a deep level trap to convert the p type (n type) semiconductor region 6 into a semi-insulating region, recessing the semiconductor layer 6 and then epitaxially growing an opposite type doped material layer in the recess area followed by CMP polishing, or by implanting a p type (n type) well region that extends from the upper semiconductor surface 6a beyond the Smart Cut depth and optionally forming a p+ (n+) retrograde ion implant layer with a peak dopant concentration at approximately the smart cut depth into an n type (p type) semiconductor layer 6 (FIG. 11). If a Schottky bottom side contact 34 is used, there can be a natural isolation between laterally adjacent detector elements. Ion implantation isolation steps can be performed prior to growth of graphene material 10. Due to fixed positive charge in native oxide and deposited oxide material, there can be a surface inversion layer on the bottom surface of the UV/EUV photodetector cell 32. The n type (p type) material between laterally separated detector cells 32 will typically have an accumulated surface and thus, there will not be a surface inversion layer conduction path between laterally separated detectors 32.

Figure 14:
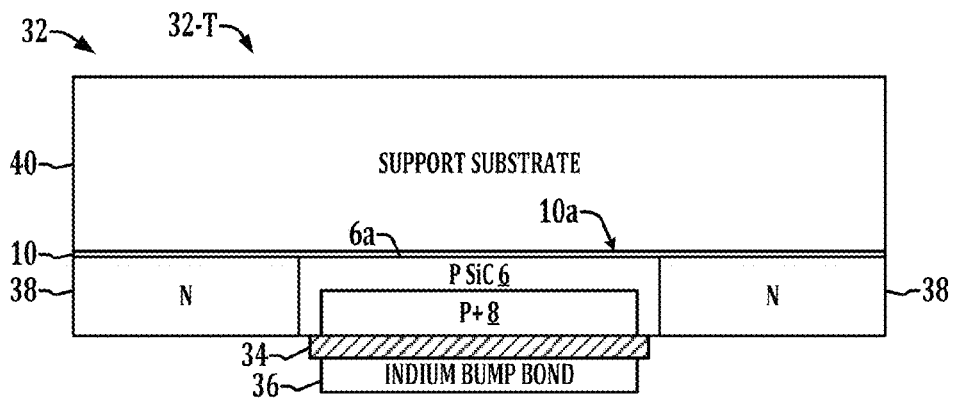
Figure 15:
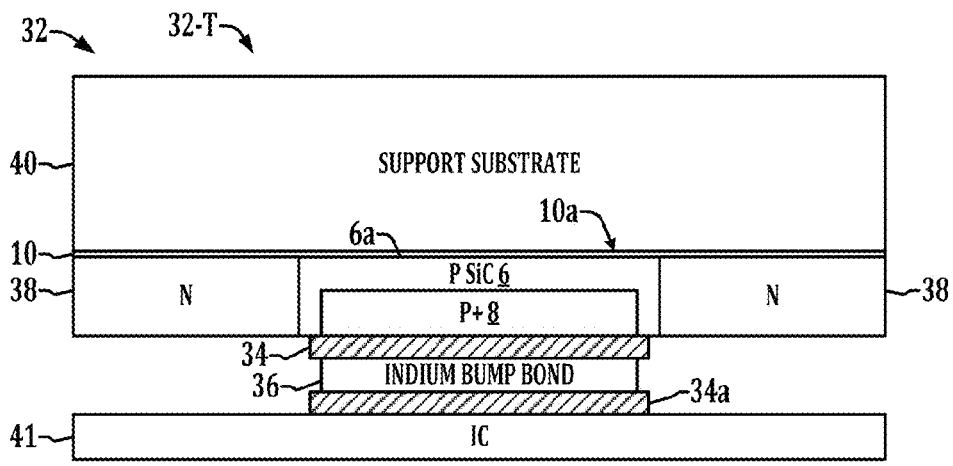

As seen in FIG. 14, an ohmic metal layer 34 is deposited and patterned so that the metal 34 resides within the outside boundary of the p type region 8 on the Smart Cut surface. This ohmic metal contact 34 facilitates provision of a top side illuminated graphene 10 on the semiconductor 6 for detecting UV/EUV to provide a PiN "like" photodetector 32 with a backside ohmic contact 34. Alternatively, a Schottky metal layer 34 can be deposited and patterned so that the metal 34 resides within the outside boundary of the n type (p type) region on the smart cut/CMP polished lower surface. Such a Schottky metal contact 34 also facilitates a top side illuminated graphene on semiconductor UV/EUV photodetector 32 with a backside Schottky contact 34. An anneal can then be performed to form an ohmic contact to the SiC material 6, and an indium bump bonding structure 36 is then formed, and the UV/EUV photodetector array is bump bonded to and an underlying conductive metal structure 34a of a silicon readout circuit 41 as shown in FIGS. 15 and 16. Such a graphene/semiconductor/metal contact photodetector is operable with the graphene material layer/semiconductor junction reverse biased and with the Schottky metal/semiconductor junction forward biased.

As seen in FIG. 16, a silicon support substrate 40 can be optionally thinned and then a portion of the silicon support substrate 40 can be etched to expose the graphene surface 10a while leaving a portion of the silicon support substrate 40 on the surface of the remainder of the graphene layer 10 to act as top side mechanical support for the apparatus. A combination of plasma etching and chemical etching can be used in one example to etch the silicon support substrate 40 down to the graphene surface 10a with the chemical etch used to etch a silicon support 40 on graphene 10 without damaging the graphene material 10. An etch stop layer such as a thin oxide layer (not shown) can be used between the silicon support substrate 40 and the graphene layer 10 to act as an etch stop to the graphene layer 10, which can later be removed. In certain embodiments, it may be beneficial to provide that there be electrical connection between the silicon support material 40 and the graphene material layer 10 to provide an electrical potential to the silicon support substrate 40. An ohmic contact can be made to the silicon support substrate to make an electrode connection to the silicon support substrate that further provides an electrical connection to the graphene 10.

Related embodiments involve the use of a p well, using similar processing as that described above in connection with FIGS. 11-16, except that a p type well region is implanted which extends from the surface to beyond the Smart Cut depth and an optional P++ retrograde ion implant layer may be formed with a peak dopant concentration at approximately the smart cut depth into an n type semiconductor layer. An alternate approach to obtain a p type well in the case of SiC is to diffuse boron into the SiC layer. For example, a shallow boron can be implanted into the SiC and then diffused into SiC using an anneal temperature of approximately 1700-1800° C. The surface of the SiC can be CMP polished after the high temperature anneal to remove the shallow p type implant damage region. Isolation between laterally separated photodetector elements is achieved by the presence of the unimplanted n type (p type) semiconductor layer.

Figure 17:
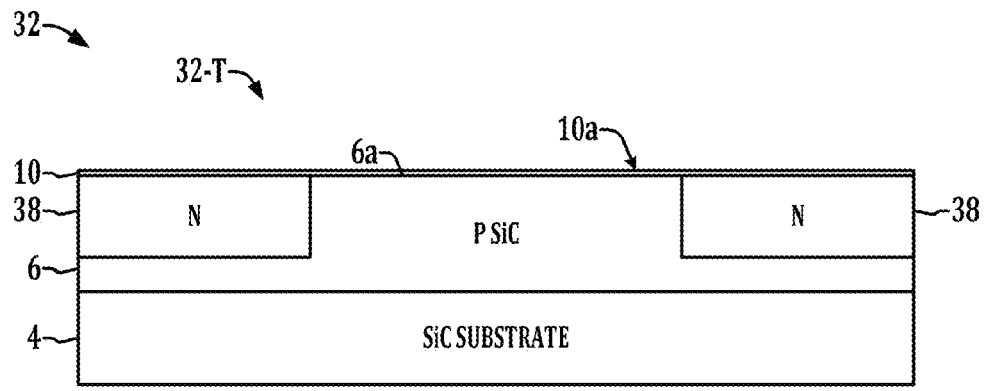
FIGS. 17-22 are partial sectional side elevation views illustrating fabrication of a bottom side contacted detector similar to that of FIG. 8.
Figure 18:
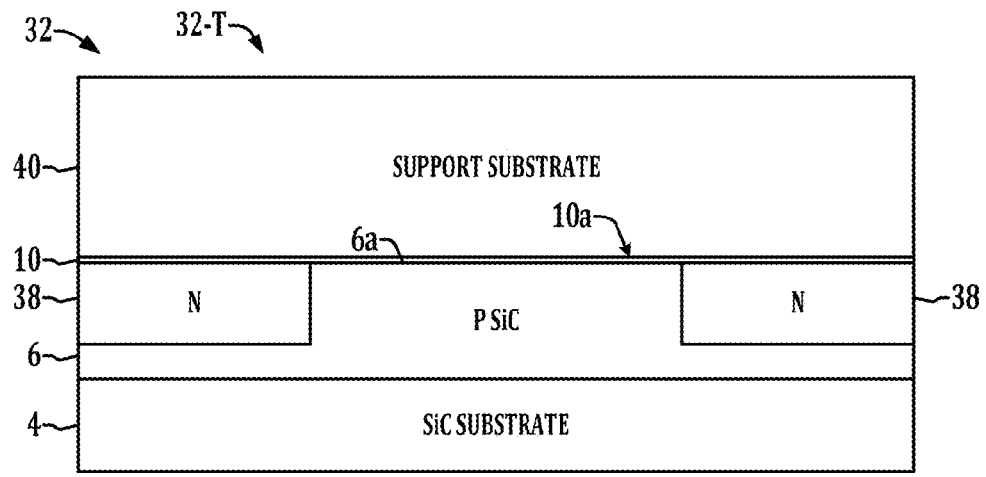
Figure 19:
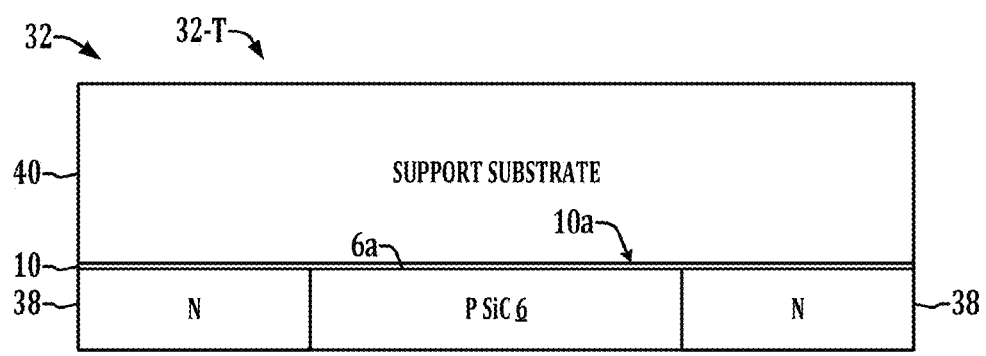
Figure 20:
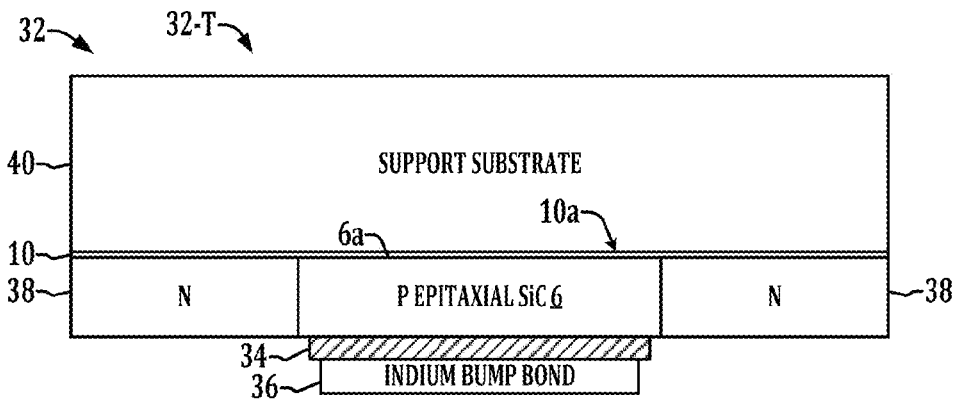
Figure 21:
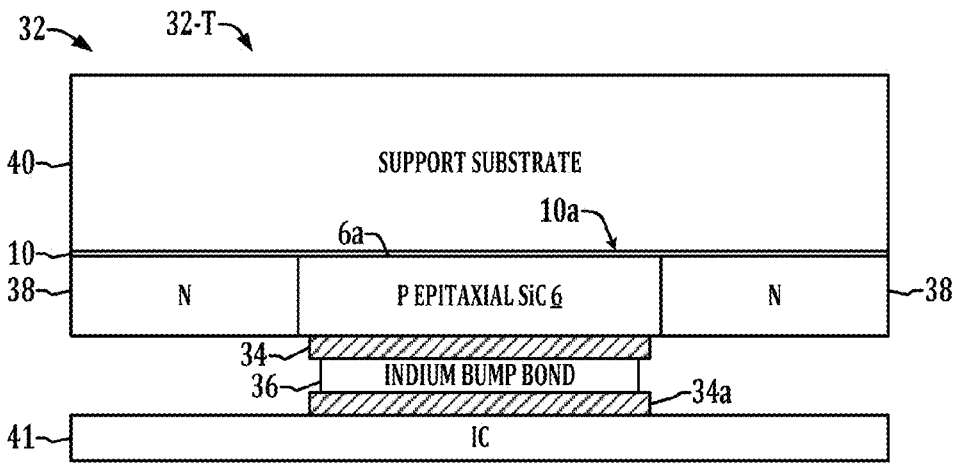
Figure 22:
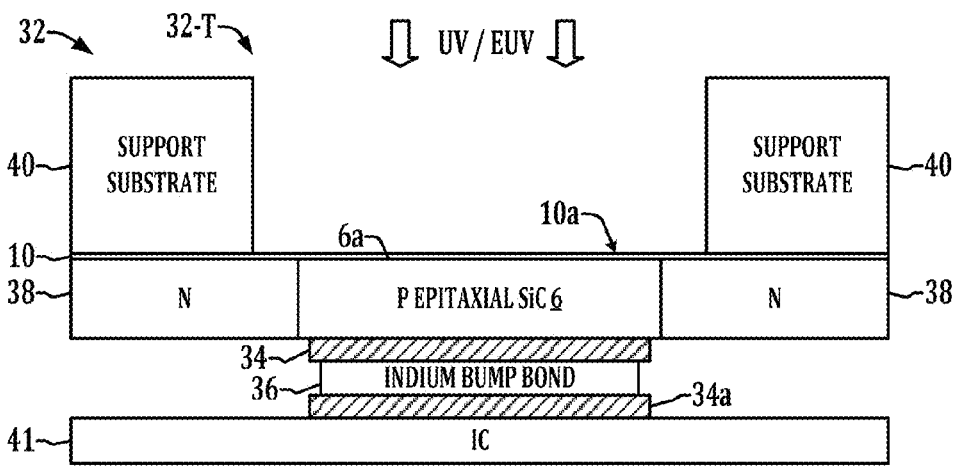

FIGS. 17-22 illustrate another example providing a bottom side contacted detector similar to that of FIG. 8. In FIG. 17, optional n type implants or trenches are formed to create isolation regions 38, and hydrogen implantation is performed to a Smart Cut depth. A silicon support substrate 40 is then wafer bonded to the upper graphene surface 10a as seen in FIG. 18, and the structure is heated in FIG. 19 to split the wafer using the above-described Smart Cut processing techniques. Unlike the example in FIGS. 11-16 above, however, a Schottky metal contact 34 is created on the bottom side of the Smart Cut surface (optionally polished or oxidized to reduce Smart Cut damage), as seen in FIG. 20, and no retrograde implantation need be done for the bottom side Schottky contact implementation. The indium bump bond 36 is then formed in FIG. 20, and the structure is bonded to a conductive portion 34a of a readout integrated circuit 41 as seen in FIG. 21. Thereafter, the upper support substrate 40 is processed to remove a portion thereof in FIG. 22, thereby exposing the upper surface 10a of the graphene layer 10 as described above in connection with FIG. 16.

Figure 23:
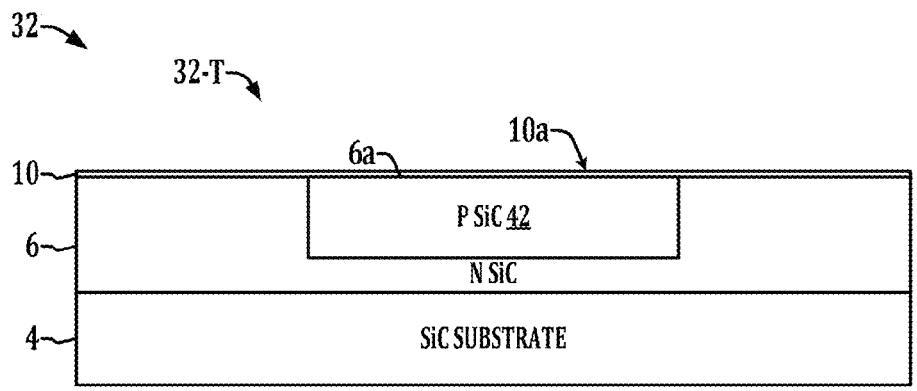
FIGS. 23-28 are partial sectional side elevation views illustrating fabrication of another bottom side contacted detector similar to that of FIG. 9.
Figure 24:
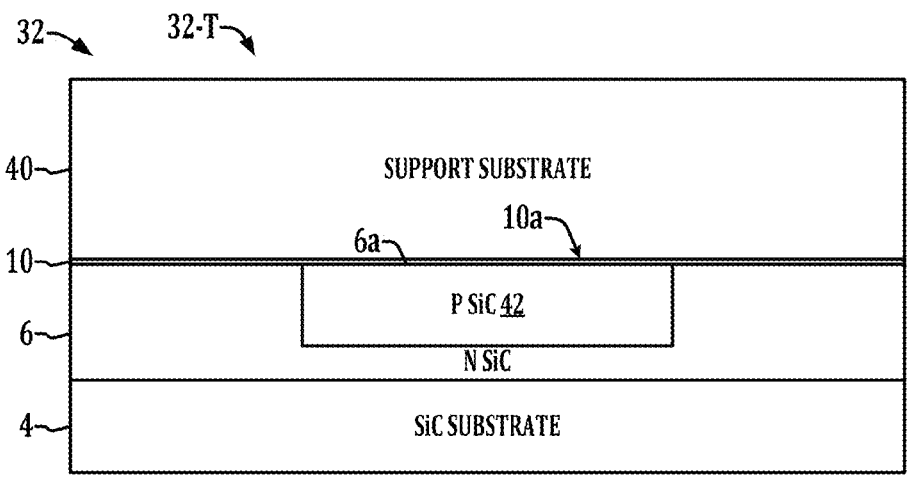
Figure 25:
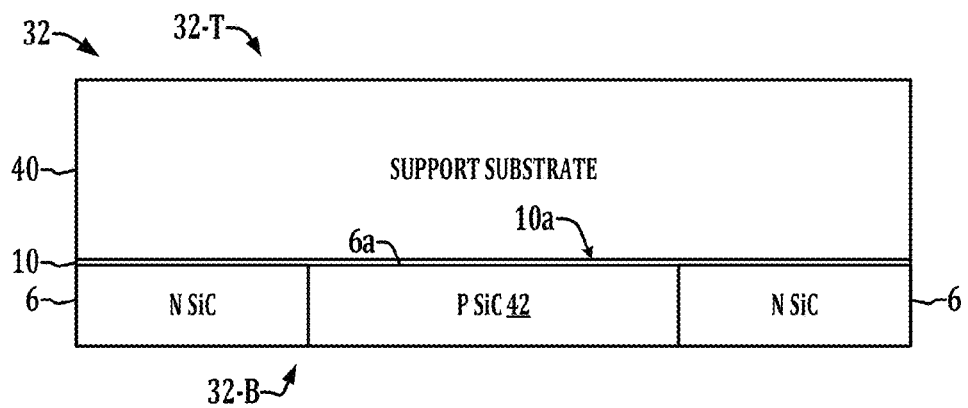
Figure 26:
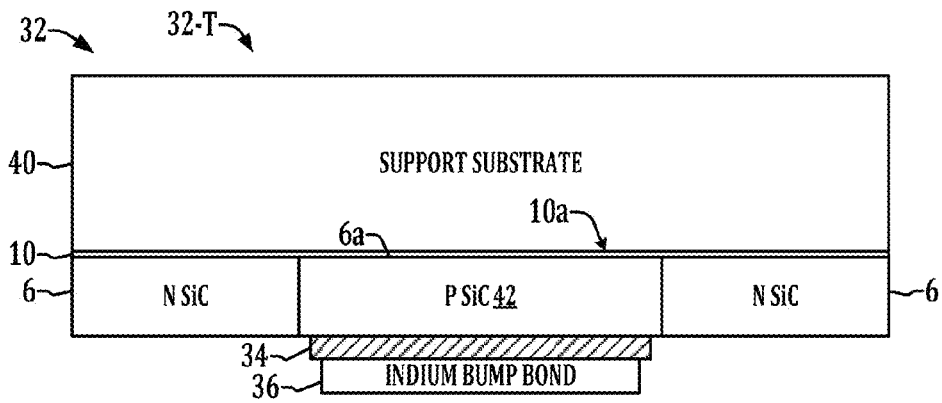
Figure 27:
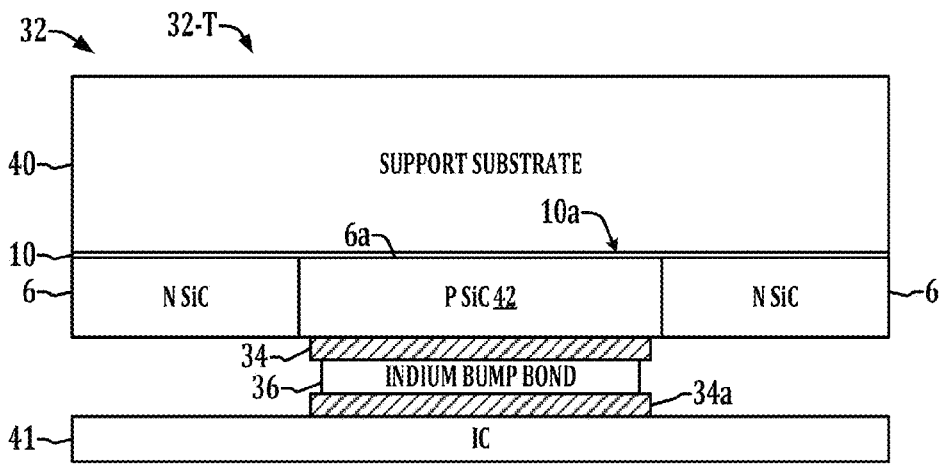
Figure 28:
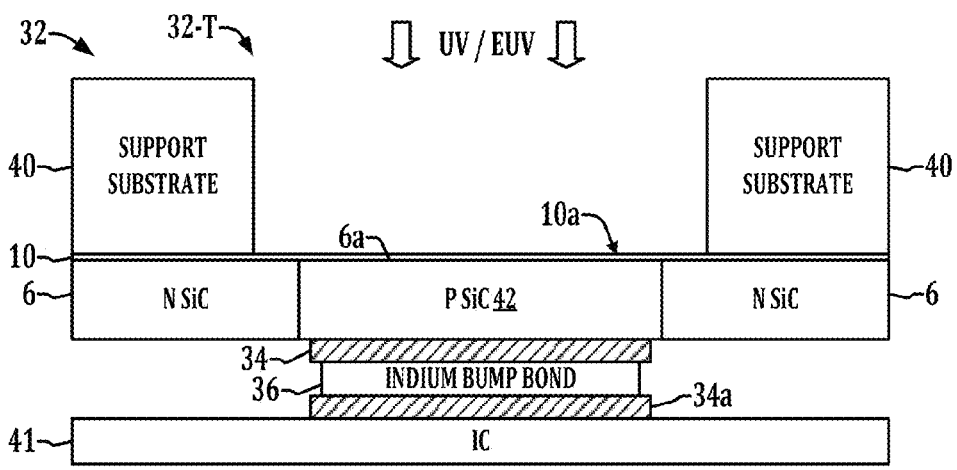

Another example is illustrated in FIGS. 23-28 to form a top side illuminated, bottom side Schottky contacted photodetector apparatus using the Smart Cut processing using an n type semiconductor layer with formation of a p well. In FIG. 23, graphene 10 is formed on an n type silicon carbide semiconductor structure 6, and nitrogen is implanted or trenches are formed for isolation, along with an optional retrograde aluminum or boron implant followed by high temperature annealing as described above. As seen in FIG. 23, a p type implantation is performed to provide a p type silicon carbide region 42, and hydrogen implantation and retrograde aluminum or boron implantation are performed to a prospective Smart Cut depth. In FIG. 24, a silicon support substrate 40 is wafer bonded to the top surface 10a of the graphene layer 10, and the structure is heated in FIG. 25 to split the wafer via Smart Cut processing. As seen in FIG. 26, the above described techniques are used to form a Schottky metal contact structure 34 in the lower side of the Smart Cut separation line for connection to the p type silicon carbide region 42, and an indium bump bond structure 36 is formed as described above. Thereafter in FIG. 27, the structure is bump bonded via conductive metal structure 34a to the integrated circuit 41, and the overlying support substrate 40 is patterned to expose a portion of the graphene layer 10 as seen in FIG. 28.

Alternate implementations are possible in which a substrate etch process or laser ablation process are used for a p type (n type) semiconductor structure 6. The processing in such cases is generally similar to that described above in connection with FIGS. 11-16, except that the process will typically be used for the case of III-Nitride epitaxial layers grown on a substrate that can be removed from the substrate by etching the substrate away or by illuminating the epitaxial layer/substrate interface with a laser to ablate a portion of the material or covalent bonds at the epitaxial layer/substrate interface to allow the epitaxial layers to separate from the substrate. A wafer bonded front side support substrate is used similar to that used in the example of FIGS. 11-16 above. Isolation between laterally adjacent detector cells 32 can be created by the above described techniques. If a Schottky backside contact is used, there can be a natural isolation between laterally adjacent detector elements. The ion implantation steps for isolation can be performed prior to graphene material layer growth or transfer/bond processing. Due to fixed positive charge in native oxide and deposited oxide material, there can be a surface inversion layer on the bottom detector surface. The n type material between laterally separated detectors will typically have an accumulated surface and thus, there will not be a surface inversion layer conduction path between laterally separated detector elements. For III-Nitride materials, the exposed surface after the substrate etch and nucleation etch process will be a nitrogen-face material layer. A non-alloyed ohmic contact can be made to the nitrogen-face III-Nitride materials. The process for forming ohmic contact metal, indium bump bond, bonding to a readout integrated circuit 41, and etching the silicon support substrate 40 in selected regions to provide mechanical support to the graphene material layer/semiconductor layer structure can be the same as described above in connection with FIGS. 11-16.

Figure 29:
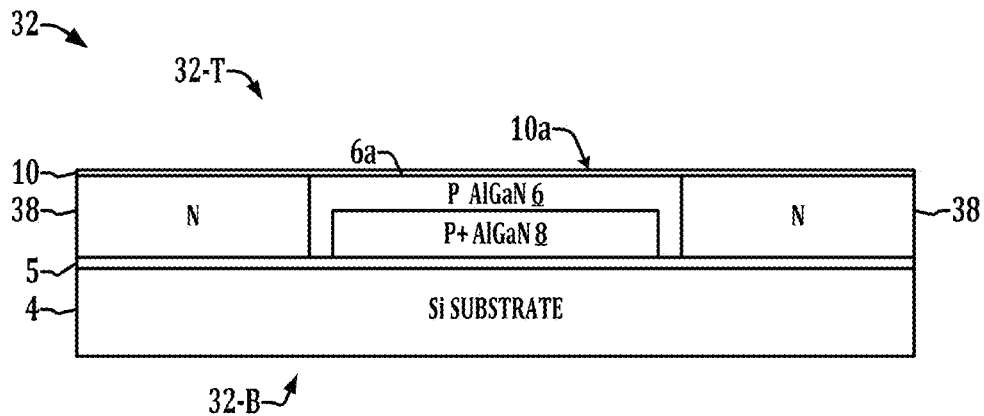
FIGS. 29-34 are partial sectional side elevation views illustrating fabrication of a bottom side contacted detector similar to that of FIG. 9 using an aluminum gallium nitride semiconductor structure.
Figure 30:
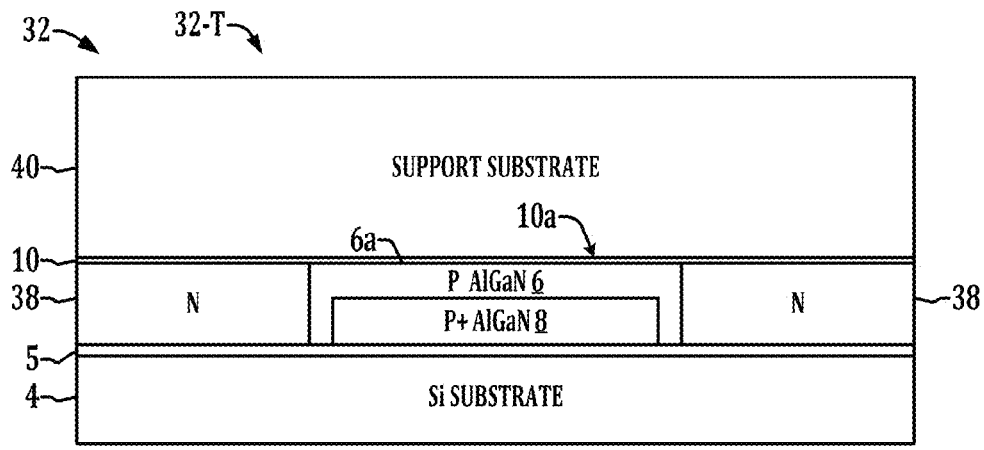
Figure 31:
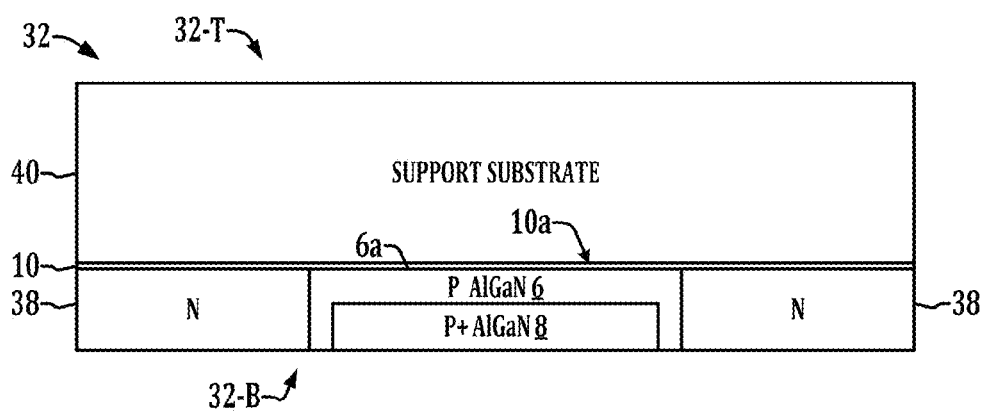
Figure 32:
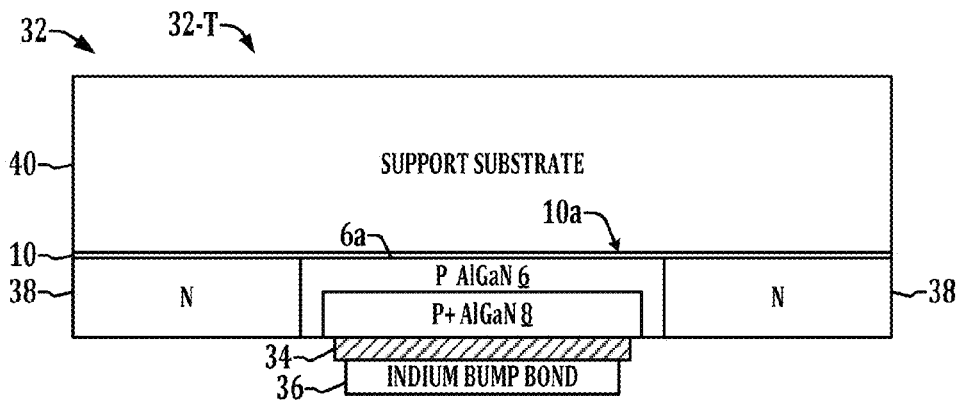
Figure 33:
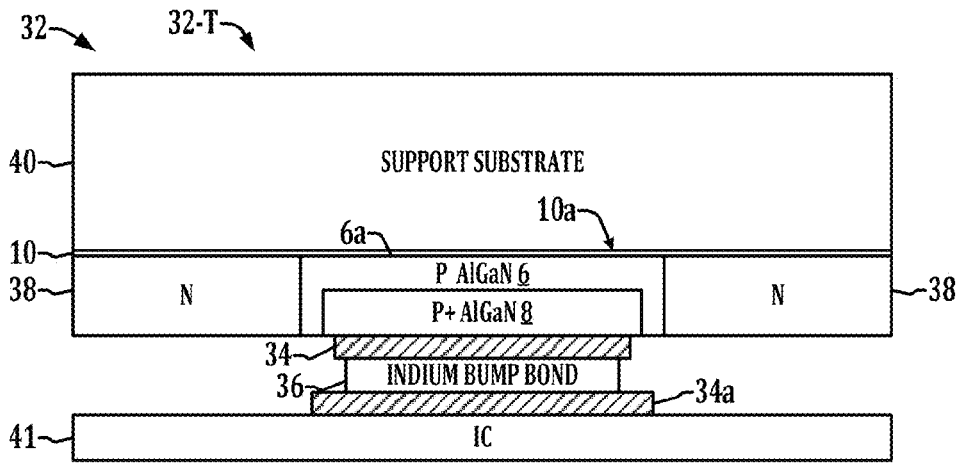
Figure 34:
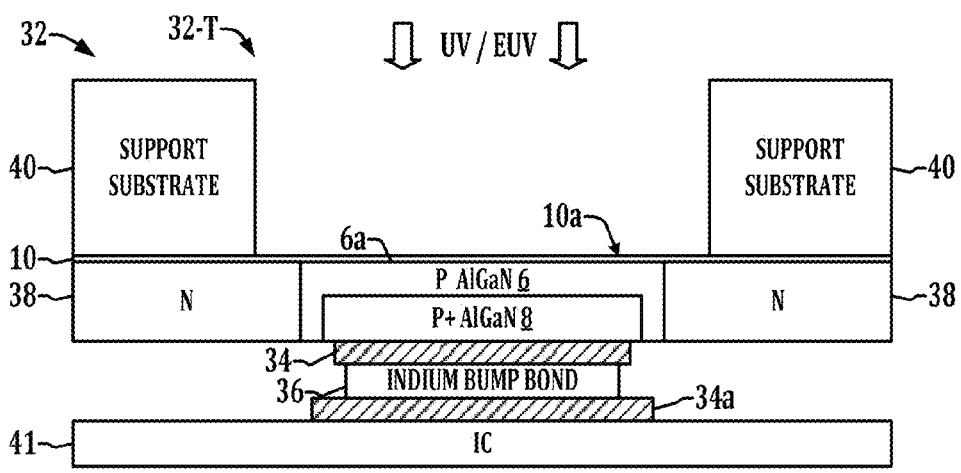

FIGS. 29-40 illustrate further examples using an aluminum gallium nitride semiconductor structure 6 instead of silicon carbide described in the above embodiments. FIG. 29 illustrates an exemplary cell 32 in which an aluminum nitride nucleation layer 5 is formed on a silicon substrate 4, and a p type epitaxial aluminum gallium nitride layer 6 is formed over the substrate 4. The graphene layer 10 is formed above the aluminum gallium nitride 6. As seen in FIG. 29, oppositely doped isolation regions 38 are formed in the p type aluminum gallium nitride semiconductor structure 6, and a highly doped (p+) region 8 is implanted. As discussed above, the isolation structures may alternatively be formed by implantation of protons, formation of trenches, retrograde implantation using magnesium, etc. As seen in FIG. 30, a support substrate 40 is wafer bonded to the top side of the structure, and the silicon substrate 4 is etched, preferably stopping at or after the nucleation layer 5 as seen in FIG. 31. As shown in FIG. 32, moreover, a lower ohmic metal contact 34 is formed along with an underlying indium bump bond 36, for example, using the techniques described above. As seen in FIG. 33, moreover, the structure is then bump bonded to an integrated circuit 41 via conductive metal structure 34*a*, and a portion of the upper support substrate 40 is removed as seen in FIG. 34 to open the upper surface 10*a* of the graphene layer 10 for receiving UV and/or EUV radiation.

For the case of a top side illuminated/bottom side ohmic contacted UV/EUV graphene on semiconductor photodetector using a substrate etch process or laser ablation process into an n type semiconductor layer 6 along with formation of a p-well (n-well), similar processing can be performed as discussed above in connection with FIGS. 17-22. In such a case, however, a p type (n type) well region is formed (e.g., via implantation, diffusion, etc.), which extends from the surface to beyond the substrate surface, along with an optional p+ (n+) retrograde ion implant layer with a peak at approximately the nucleation layer surface into an n type (p type) semiconductor layer formed in one or more III-nitride epitaxial layers on a substrate. An alternate approach for forming a p-well (n-well) is recessing the n type (p type) semiconductor layer to the nucleation layer and then epitaxially growing the opposite type doped p type (n type) material in the recess area followed by CMP polishing. Isolation between laterally separated photodetector cells may be provided in certain embodiments by the unimplanted n type semiconductor layer.

Figure 35:
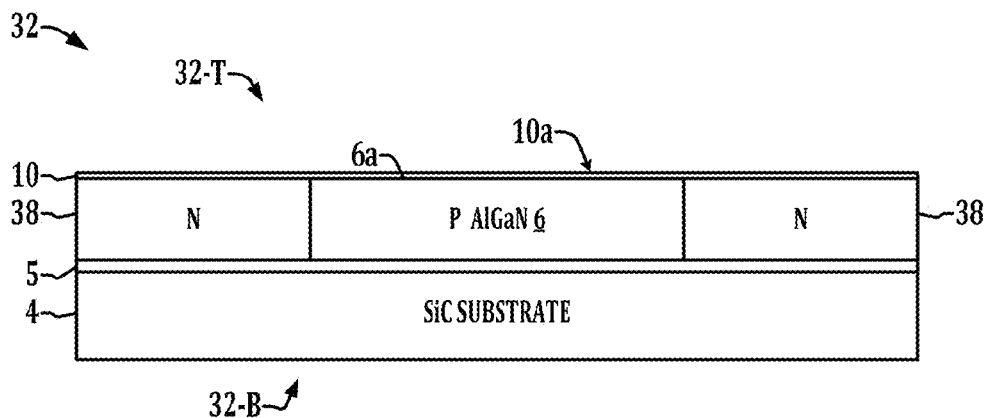
FIGS. 35-40 are partial sectional side elevation views illustrating fabrication of another bottom side contacted detector similar to that of FIG. 10 using an aluminum gallium nitride semiconductor structure.
Figure 36:
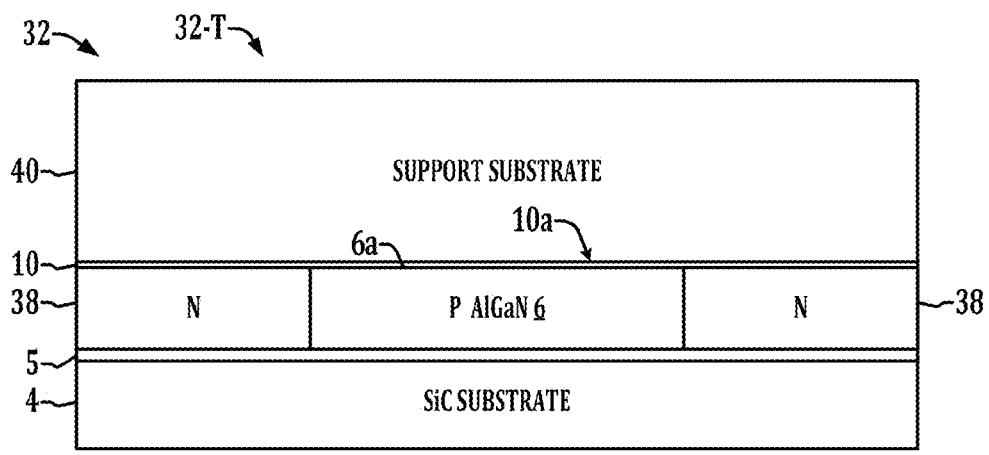
Figure 37:
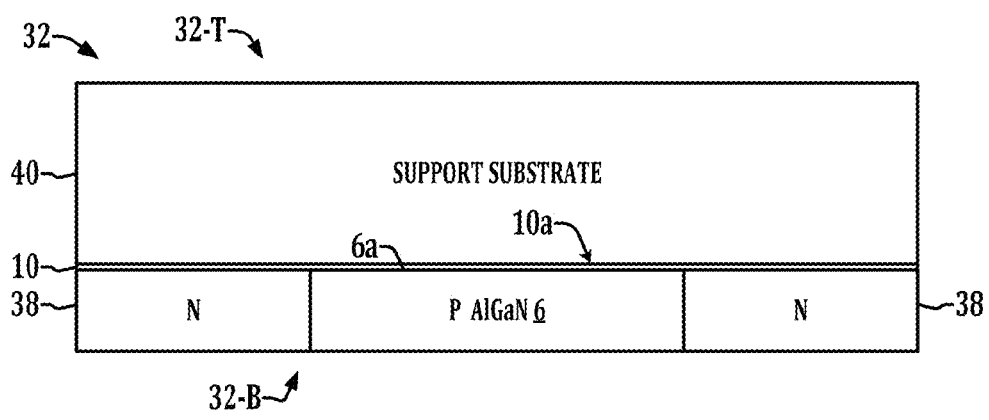
Figure 38:
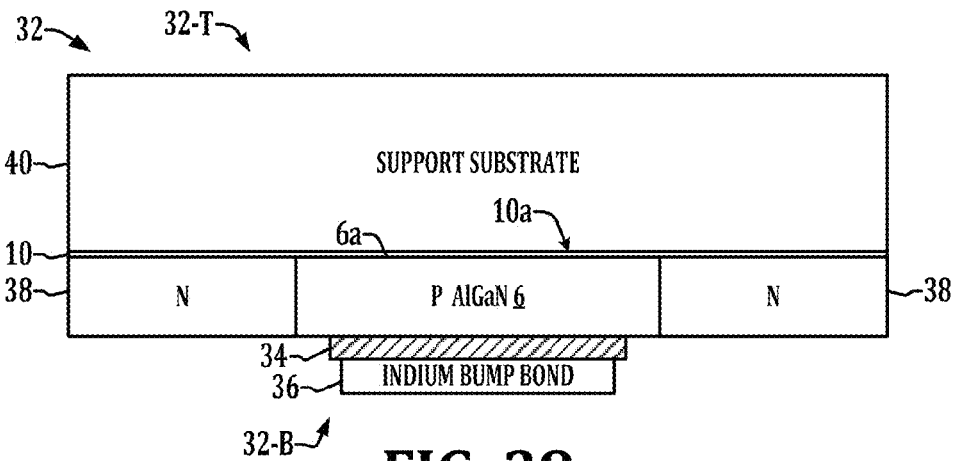
Figure 39:
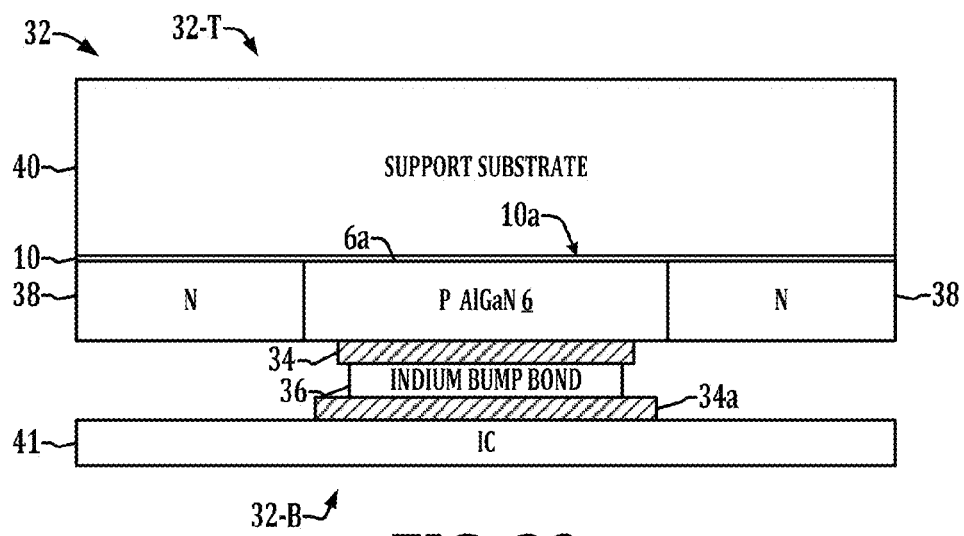
Figure 40:
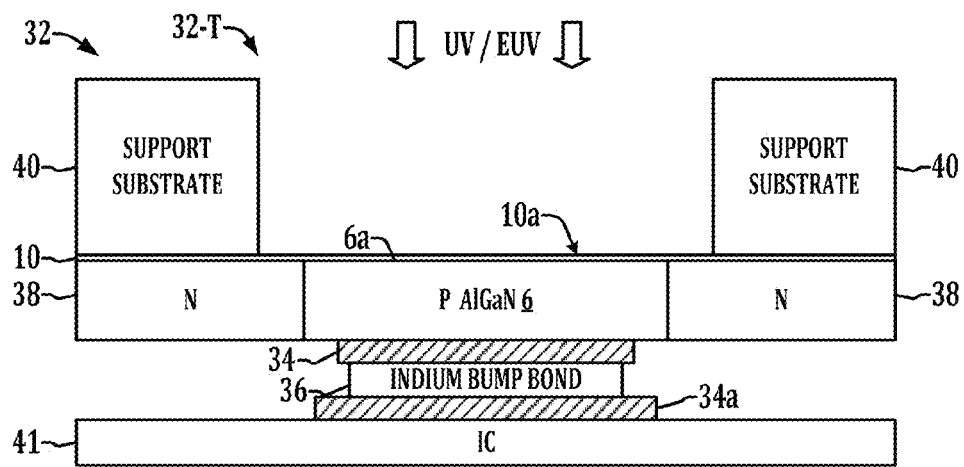

FIGS. 35-40 depict fabrication of another bottom side contacted detector similar to that of FIG. 10 using an aluminum gallium nitride semiconductor structure 6, in which the associated processing is similar to that discussed above in connection with FIGS. 29-34, except that a Schottky metal contact is formed on the bottom side of the Smart Cut surface (optionally polished or oxidized to reduce Smart Cut damage). The p+ type (n+ type) retrograde ion implant is also not used for the case of the backside Schottky contact 34. In FIG. 35, isolation structures 38 are created within a p type aluminum gallium nitride semiconductor structure 6, for example, using one or more of the above described techniques, and a retrograde magnesium implant is performed, with a silicon support substrate 40 being wafer bonded to the upper side of the structure as seen in FIG. 36. The underlying silicon substrate 4 is then etched as seen in FIG. 37 to expose the p type aluminum gallium nitride region 6 and the graphene layer 10, and an ohmic metal contact structure 34 is formed along with an underlying indium bump bond structure 36 as shown in FIG. 38, for example, using the techniques described above. As seen in FIG. 39, the structure is then bump bonded to an integrated circuit 41 via a conductive structure 34*a*, and a portion of the upper surface 10*a* of the graphene layer 10 is exposed by removal of portions of the upper support substrate 40 as seen in FIG. 40. Schottky bottom side contacted embodiments may be created using the above described processing techniques, with a Schottky metal contact 34 being formed on the bottom side of the Smart Cut surface (optionally polished or oxidized to reduce Smart Cut damage), in which no p+ type (p+ type) retrograde ion implant is required.

The graphene material on semiconductor preferably forms a graphene material layer/semiconductor heterojunction that when properly biased allows photogenerated electrons (or holes) within a p type (n type) semiconductor to transport from the semiconductor material to the graphene material layer electrode and result in a current from the electrons (holes) flowing in the graphene electrode to a bias supply. The graphene material layer/semiconductor heterojunction can also provide a controlled surface potential on the surface of a semiconductor without a dead layer. Graphene material layers can advantageously be very thin, for example, as thin as a single sheet of graphene in certain embodiments, such as about 3.0 nm or less and thickness in certain embodiments, and graphene advantageously absorbs only a small fraction of incident light, particularly for ultraviolet detection including ultraviolet A, ultraviolet B, ultraviolet C, near ultraviolet, middle ultraviolet, far ultraviolet, extreme ultraviolet, vacuum ultraviolet, X-ray, soft X-ray detection, visible detector/imager, near infrared detector/imager, neutron detector/imager, and electron bombardment imager applications. In this regard, EUV light is absorbed in approximately 10 nm of the semiconductor material 6, and a single sheet of graphene 10 is approximately 0.3 nm thick and thus, a high percentage of the EUV light can transit through the graphene 10 into the semiconductor 6.

Figure 41:
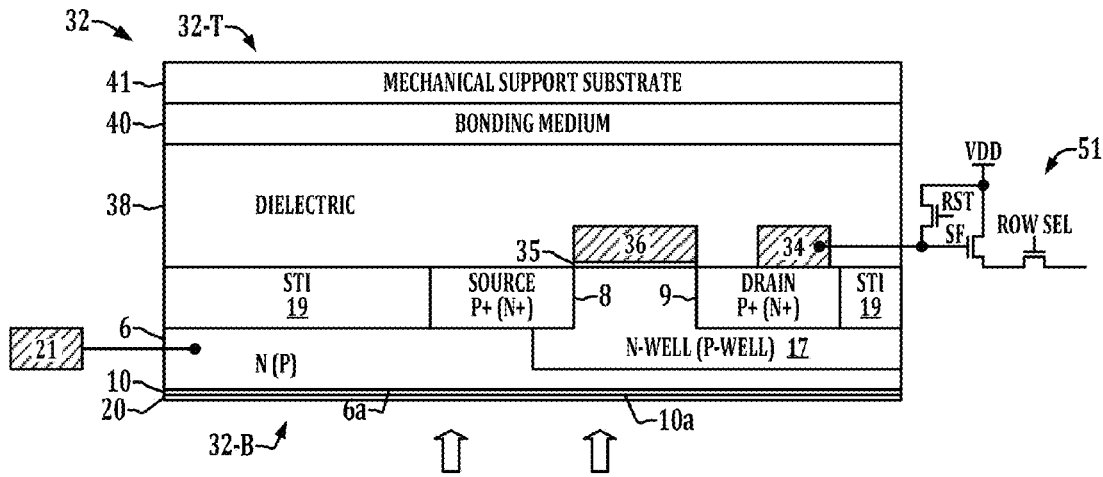
FIG. 41 is a partial sectional side elevation view illustrating another exemplary bottom side contacted detector in a CMOS integrated circuit configuration with a contact electrically connected to an N type semiconductor structure via a CMOS transfer transistor.

FIGS. 41-42 and FIGS. 44-47 show further detector apparatus embodiments 32 in which the first contact structure 34 is electrically connected to the P+ (N+) doped region (8) that collects photogenerated carriers via a MOSFET transistor (8, 9, 34, 35, 36). The implementation in FIGS. 41-42 and FIGS. 44-47 refer to a P+ (N+) doped region 8 that collects photogenerated carriers; however, a MOS photogate in region 8 instead of the P+ (N+) doped region can also be used to collect photogenerated carriers as is known to those skilled in the art. The charge that is integrated in the inversion layer beneath the MOS photogate can be transferred to the floating drain 9 when the MOSFET 6 changes voltage to turn on the transfer switch. FIG. 41 illustrates a bottom side contacted detector 32 in a CMOS integrated circuit configuration with a first contact 34 electrically connected to an N type semiconductor structure 3 via an n channel CMOS transfer transistor that includes a P+ source 8 and a P+ drain 9 on laterally opposite sides of a channel region of an N-well 17, as well as a conductive control gate 36 spaced from the channel by a gate dielectric 35. The P+ drain 9 can also be considered to be a floating drain which changes it voltage when charge is transferred to the P+ drain 9 and after sensing the voltage using the circuitry 51 is reset to a selected potential using circuitry 51. In this embodiment, the drain 9 is connected to a contact structure 34 for electrical connection to the semiconductor structure 6 through the n channel FET when the FET is on. In certain embodiments, the graphene layer 10 may optionally be transferred to the semiconductor surface 6*a* or may be deposited thereon, such as using chemical vapor deposition or other suitable graphene deposition techniques. The embodiments of FIGS. 41 to 47 are particularly advantageous for monolithic active pixel imager and charge coupled imager applications, and can be used for ultraviolet detection including ultraviolet A, ultraviolet B, ultraviolet C, near ultraviolet, middle ultraviolet, far ultraviolet, extreme ultraviolet, vacuum ultraviolet, X-ray, soft X-ray detection, as well as for visible detector/imager, near infrared detector/imager, neutron detector/imager, and electron bombardment imager applications.

The embodiments in FIGS. 41-47 will typically be implemented in silicon semiconductor material and can be used near infrared light, visible light, UV light, EUV light, vacuum UV light and imaging of electrons (electron bombarded imager) that are generated by a phosphor or photocathode. The embodiments in FIGS. 41-42 and FIGS. 44-47 will typically have CMOS circuitry monolithically integrated into the semiconductor structure 6 to provide such functions as clock generated circuits, multiplexer circuits, readout circuits, buffer elements and other CMOS devices and circuits. There will be a reverse bias or alternately a zero bias between P+ (N+) doped region 8 and n type (p type) semiconductor structure 6 that allows separation and collection of photogenerated hole and electrons. For the case of P+ doped region 8 and n type doped semiconductor structure 6, photogenerated hole carriers will transit to the P+ doped region 8 and electrons will transit to the n-type semiconductor structure 6 and generate a current that will conduct to the electrical contact 21 for the n-type semiconductor structure 6. The electrical contact 21 to semiconductor structure 6 will typically be made outside of the photodetector cell 32 and the electrical contact 21 will typically contact the semiconductor structure 6 near the perimeter of an imager that is composed of one-dimensional or two-dimensional array of photo detector cells 32. The semiconductor structure 6 can have sufficient dopant concentration in the semiconductor so that it is partially depleted or alternately fully depleted by a reverse bias applied between P+ (N+) doped region 8 and the n-type (p-type) semiconductor structure 6. FIG. 41-42 and FIGS. 44-47 illustrates a bottom side illuminated photo detector cell 32 in a monolithic active pixel CMOS integrated circuit configuration with a first contact 34 electrically connected P+ (N+) source 8 of a p channel MOSFET transfer transistor when the p-channel MOSFET transistor is turned on. The MOSFET transfer transistor includes a P+ (N+) source 8 and a P+ (N+) drain 9 on laterally opposite sides of a conductive transfer gate 36 of a MOSFET transfer transistor spaced from the channel by a gate dielectric 35. In the embodiment shown in FIGS. 41-42 and FIG. 44-47, the drain 9 is connected to a contact structure 34 for electrical connection to the P+ (N+) doped region 8 through the p channel MOSFET when the MOSFET is turned on. The N-well (P-well) is typically used to establish electric field and potential profiles so that the photogenerated charge is initially directed to and integrated on P+ (N+) doped region 8 and not directed to and integrated on the P+ (N+) drain 9. The increased doping concentration in the N-well (P-well) relative to the doping concentration in the semiconductor structure 6 can also reduce effects such as drain induced barrier lowering, short channel effects, and punch through between the P+ (N+) drain 9 and the P+ (N+) source 8 that could result if the N-well (P-Well) was not present. The Shallow Trench Isolation STI regions 19 are optional but are typically included in CMOS process to provide isolation between transistors and can optionally be used in the photo detector cell 32 to provide isolation between P+ (N+) doped regions 8 in one photocell and the P+ (N+) drain 9 in an adjacent cell. The optional coating layer 20 may be a protective layer, an anti-reflectance material, a filter, a neutron conversion material such as lithium fluoride that contains enriched isotopes of lithium (6LiF) or a boron material that contains enriched isotopes of boron (10B) that generate alpha particles or tritium particles that generate hole and electron pairs in the semiconductor structure 6, and/or a micro lens in certain embodiments, or may be omitted in other embodiments.

For the embodiments shown in FIGS. 41 and 44-46, the graphene layer 10 performs the function of controlling the potential on the surface 6a of the semiconductor structure 6 and also provides a resistance lowering layer for the lateral resistance of semiconductor structure 6. The lateral sheet resistance of the semiconductor structure 6 can be high and there can be lateral voltage drops that modify the potential on the surface 6a of the semiconductor structure due to photocurrent. For embodiments in which the electrical contact 21 is made at the periphery of a large array of photodetector cells 32, the lateral distance from the electric contact 21 to the photodetector cells within the array can be large leading to a high effective resistance in the semiconductor structure between the location of photocurrent generation and the electrical contact 21. The semiconductor structure 6 can be optionally fully depleted. A fully depleted semiconductor structure 6 will have a large lateral sheet resistance value between the photocurrent generation location and the electrical contact 21. The graphene layer 10 can have sheet resistance values that depend on the number of graphene sheets with sheet resistance values less than 1500 ohms/square for one graphene sheet and less than 500 ohms/square for graphene layers that have multiple sheets of graphene. The graphene layer 10 can be optionally doped to lower the sheet resistance and secondly to vary the height of the potential barrier between the graphene layer 10 and the semiconductor structure 6.

For the embodiments in FIGS. 41 and 44-46, the graphene layer 10 can be electrically connected to the electrical contact 21. Additional processing can be performed to make a low resistance conductive structure that connects the graphene layer 10 directly to the semiconductor structure 6 by etching the graphene in a selected region and overlapping the graphene and semiconductor with an ohmic contact metal that would directly short the graphene layer 10 to the semiconductor structure 6. There are other processing approaches of shorting the graphene layer 10 to the semiconductor structure 6 that is known to those skilled in the art. In other possible embodiments, the graphene layer 10 can be electrically connected to the contact 21 by leakage current or the conduction current of the graphene/semiconductor heterojunction. For n type doped graphene layer 10 and n-type semiconductor structure 6, increasing the n-type dopant concentration will decrease the potential barrier height and lead to increased current across the heterojunction lower heterojunction resistance. The parallel combination of the resistance lowering graphene layer 10 and the semiconductor structure 6 have a lower resistance then than the semiconductor 6 alone. For n type semiconductor structure 6, the graphene is preferably n type doped to lower the potential barrier height for the graphene/semiconductor heterojunction. The potential profile of n type graphene on n type silicon semiconductor structure 6 will have a potential profile similar to that for a Schottky metal on n type silicon semiconductor. When sufficient n type doping is incorporated in or on the graphene layer 10, the potential barrier can be reduced and substantial current can conduct between the graphene layer 10 and the semiconductor structure 6. In some embodiments, increase doping concentration in the graphene can lead to flat band condition In the semiconductor structure 6 so that the dead layer in the semiconductor structure near the surface 6a that traps a portion of the photogenerated holes is minimized or eliminated. It is also desirable that the native oxide on the surface of the semiconductor be removed prior to disposing the graphene layer 10 on the semiconductor. For silicon semiconductor, an approach to minimize the native oxide on the surface of silicon is to use a dilute hydrofluoric acid etch to remove the native oxide and then either follow with no water rinse or a minimal water rinse. This process leave the silicon surface hydrogen terminated. The hydrogen on a silicon surface can remain hydrogen terminated for approximately an hour in room ambient. Other chemical or gas vapor techniques can be used to remove native oxide or other semiconductor surface. For example, NaOH treatment can be used to remove substantial native oxide from the surface of gallium nitride compound semiconductor structure. Among the techniques that can be used to dispose a graphene layer 10 on the semiconductor structure surface 6a are the techniques of transferring a graphene layer to the semiconductor surface 6a, by depositing a graphene layer 10 using plasma CVD, or by disposing graphene nanoplatelets on the semiconductor surface. The graphene layer 10 can be nonplanar with the semiconductor structure surface 6a. The graphene layer 10, for example, can be rippled, or wavy, or corrugated, have ridges, or angled, or other embodiments where the graphene layer having one or more graphene sheets are nonplanar with the semiconductor surface 6a. One approach to form nonplanar few layer graphene sheet material on the surface of semiconductor material 6a is by microwave plasma enhanced chemical vapor deposition as described by N. Soin, et al., *Materials Chemistry and Physics* 129 (2011) pp. 1051-1057. It is desirable that the graphene layer be thin enough so that it is transparent to the incident light.

The description of the embodiment in FIG. 41 and FIGS. 44-47 is an exemplary description. For example, there are alternate implementation for providing isolation between photocells 32 and alternate designs of the n-well within the photodetector cell 32 known to those skilled in the art. The resistance lowering feature and surface potential control feature of the graphene layer 10 will improve the performance of monolithic active pixel photodetector cells 32 known to those skilled in the art that do not have the resistance lower feature and surface potential control feature of the graphene layer 10. Through silicon vias are typically made at the periphery of the imager array to make electrical contacts to the CMOS circuitry in the periphery of the imager array as known to those skilled in the art.

As further shown in FIGS. 41-47, moreover, a monolithic or hybrid integrated circuit 51 may be provided including a reset transistor (RST) used to reset the individual P+ (N+) drain 9 after sensing the voltage that is on the P+ (N) drain 9 using a source follower transistor (SF) with the source of the source follower transistor connected to a row select transistor for reading data from the photo detector cell 32. The operation of the photodetector cell includes integrating photogenerated carriers on the P+ (N+) doped region 8, transferring carriers from P+ (N+) doped region 8 to the P+ (N+) drain 9 by enabling the transfer gate 36, sensing the voltage on the P+ (N+) drain 9 using the source follower transistor SF and resetting the voltage on the P+ (N+) drain using the reset transistor RST.

Figure 42:
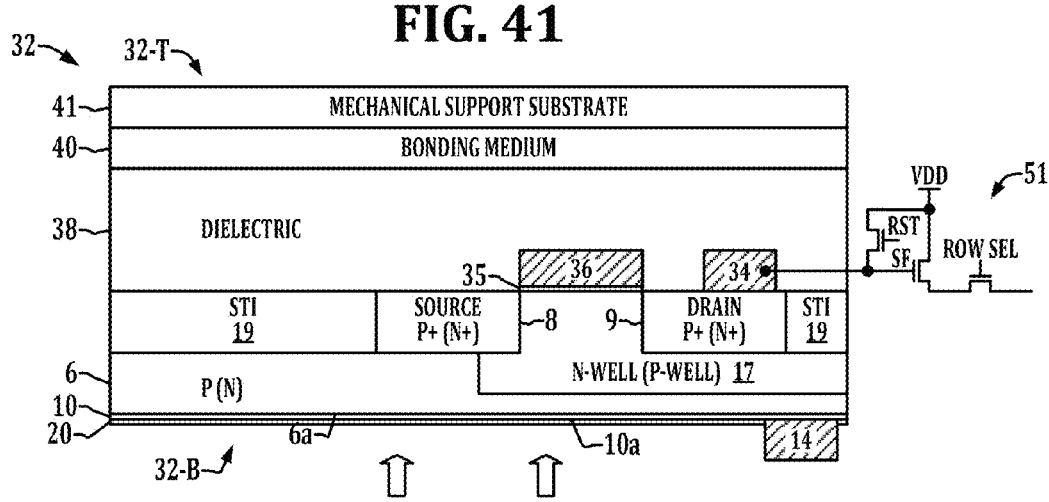
FIG. 42 is a partial sectional side elevation view illustrating a bottom side contacted detector in a CMOS integrated circuit configuration with a contact electrically connected to a P type semiconductor structure via a CMOS transfer transistor.

FIG. 42 illustrates a bottom side illuminated detector 32 in a monolithic active pixel CMOS integrated circuit configuration with a contact 34 electrically connected to a P type (n type) semiconductor structure 6 via the P+ (N+) doped region 8 and a MOSFET transfer transistor. An electrical contact 14 is connected to the graphene layer 10. For the embodiment shown in FIG. 42, a reverse bias or zero bias is established between the graphene layer 10 and the semiconductor structure 6. In contrast, the embodiment of FIG. 41 employs the graphene 10 for resistance lowering or shunting and controlling the surface potential of the surface 6a of the semiconductor structure 6. For the case of a p type doped semiconductor structure 6 and P+ doped region 8, photogenerated hole carriers will be collected by the semiconductor structure 6 and the P+ doped region 8 and photogenerated electrons will be collected by the graphene layer 10. Electrical contact 14 is used to apply a bias to graphene layer 10 and conduct the photogenerated current. The operation of the embodiment in FIG. 42 is similar to the operation of the embodiment in FIG. 41. The optional coating layer 20 may be a protective layer, an anti-reflectance material, a filter, a neutron conversion material such as lithium fluoride that contains enriched isotopes of lithium (6LiF) or a boron material that contains enriched isotopes of boron (10B) that generate alpha particles or tritium particles that generate hole and electron pairs in the semiconductor structure 6, and/or a micro lens in certain embodiments, or may be omitted in other embodiments.

Figure 43:
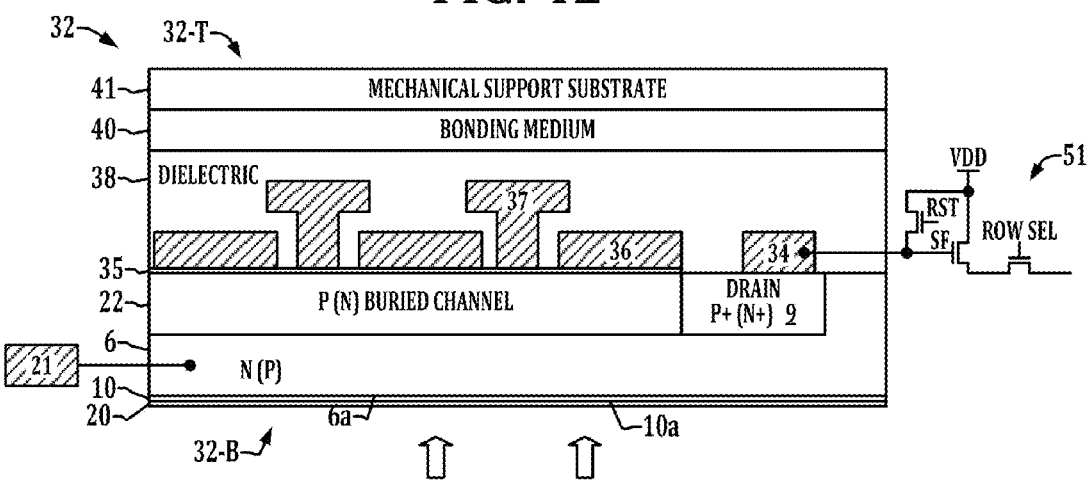
FIG. 43 is a partial sectional side elevation view illustrating another bottom side contacted detector in a CMOS configuration using an N type semiconductor structure with a P type buried channel.

FIG. 43 shows another bottom side illuminated detector in a charge coupled device configuration using an N type semiconductor structure 6 with a P type buried channel 22, and electrodes 36 and 37 which transport photogenerated charge lateral within the buried channel to the P+ (N+) drain for readout. The photon and electron transparent graphene layer 10 is for resistance lowering or shunting, controlling the surface potential of the surface 6a of the semiconductor structure 6, and/or for minimizing or eliminating a dead layer in which photogenerated carriers are trapped in a potential well near the back surface 6a of the semiconductor structure 6 due to effects such as the band bending which for the case of a n type semiconductor structure 6 trap holes near the back surface 6a and for a p type semiconductor structure 6 and trap electrons in potential wells near the back surface 6a. Doping the graphene layer 10 with n type doping using intercalation or absorbing atoms on the surface will reduce the potential barrier shown in FIG. 52 and can optionally achieve a flat band condition so that there is not a dead layer near the backside surface 6a. The low resistance of graphene layer 10 in FIG. 43 can be used to conduct current that is generated by photons or electrons to electrical contact 21. The graphene layer is connected to electrical contract 21 through the leakage current or conductive current of the graphene/semiconductor heterojunction. Additional processing can be performed to make a low resistance conductive structure that connects the graphene layer 10 directly to the semiconductor structure 6 by etching the graphene in a selected region and overlapping the graphene and semiconductor with an ohmic contact metal that would directly short the graphene layer 10 to the semiconductor structure 6. There are other processing approaches of shorting the graphene layer 10 to the semiconductor structure 6 that are known to those skilled in the art. Additionally, an electrical contact can be made to the graphene layer 10. The ability to conduct current to the electrical contact 21 is beneficial for ultraviolet detection including ultraviolet A, ultraviolet B, ultraviolet C, near ultraviolet, middle ultraviolet, far ultraviolet, extreme ultraviolet, vacuum ultraviolet, X-ray, soft X-ray detection, visible, near infrared detector, neutron detector/imager, and electron bombardment imager. The row select transistor shown in the circuit diagram 51 in FIG. 43 is optional. Other MOSFET circuit 51 implementation known to those skilled in the art can be used. The optional coating layer 20 may be a protective layer, an anti-reflectance material, a filter, a neutron conversion material such as lithium fluoride that contains enriched isotopes of lithium (6LiF) or a boron material that contains enriched isotopes of boron (10B) that generate alpha particles or tritium particles that generate hole and electron pairs in the semiconductor structure 6, and/or a micro lens in certain embodiments, or may be omitted in other embodiments.

As further shown in FIGS. 41-47, moreover, a monolithic or hybrid integrated circuit 51 may be provided including a reset transistor (RST) used to reset the individual soul prior to reading, as well as a source follower transistor (SF) with the gate connected to the contact 34 and a source/drain connected to a row select transistor for reading data from the photo detector cell 32.

FIGS. 41-47 illustrate a method to fabricate a monolithic active pixel imager with graphene 10 on the backside 32-B as a layer to perform the function of establishing the surface potential and conduct photogenerated or electron beam generated current, as shown in FIGS. 41-44. These figures also show a device structure in which the graphene layer 10 is used as a reverse bias or zero bias electrode to collect photogenerated or electron beam generated current. FIG. 41 illustrates a device structure 32 in which CMOS circuitry 51 and a monolithic active pixel photodetector cell 32 is formed in the semiconductor structure device layer 6 of a silicon-on-insulator substrate in certain embodiments. The semiconductor structure device layer 6 can include an epitaxial growth layer to increase the semiconductor of the initial semiconductor layer that is used to form a silicon-on-insulator material. The thickness of the semiconductor structure device layer 6 can be selected to be compatible for the absorption of a selected percentage of light of incident wavelengths that can be optionally filtered before absorption in the semiconductor structure 6. The semiconductor structure material layer will often comprise a silicon semiconductor layer but can include germanium, silicon germanium, III-V compound material, silicon carbide, and other semiconductor material. The semiconductor material 6 is typically preferably single-crystal semiconductor material but can also be amorphous or polycrystalline semiconductor material in certain embodiments. The method of fabricating the embodiments in FIGS. 41-47 will preferably use a silicon-on-insulator substrate. Silicon-on-insulator material can be selected to have a silicon device layer with a thickness appropriate for absorbing the photon incident wavelengths or alternately the silicon on insulator substrate can have a thin silicon layer that is made thicker by growing a silicon epitaxial layer on the silicon surface.

The silicon on insulator substrate also comprises a buried oxide layer 18 (FIG. 44) and the handle substrate 42. The buried oxide layer 18 is used as an etch stop layer for removing the handle substrate 42 (FIGS. 45 and 46). The monolithic active pixel imager may comprise a one-dimensional or two-dimensional array of active pixel cells 32 and also monolithic CMOS circuitry 51 for read out of the monolithic active pixel cell 32 and other monolithic CMOS circuits (not shown) for clock generators and addressing the active pixel cells 32, and buffering the voltage output to output signal pads. The active pixel cell 32 can be selected to be formed in a PiN detector structure, pinned PiN detector structure, or a charge transfer detector structure with a MOS gate. In FIGS. 41 to 44, the PiN detector structure may include a doped region 8 that performs as a collector for photogenerated or electron generated carrier charge. For the case of P-type doped region 8, the doped region will collect hole carriers. The photogenerated electrons will be collected by a combination of the semiconductor structure 6 and the graphene layer 10. The graphene layer 10 in certain embodiments establishes the potential on the surface 6a of the semiconductor structure 6. The photogenerated or electron generated charge will be transferred from the doped region 8 to the floating drain 9 using the transfer gate 36. The voltage on the floating drain 9 will change proportionally to the charge transferred to the floating drain 9. The floating drain voltage is buffered to the output using a source follower transistor SF and the row select transistor selects row for readout.

Figure 44:
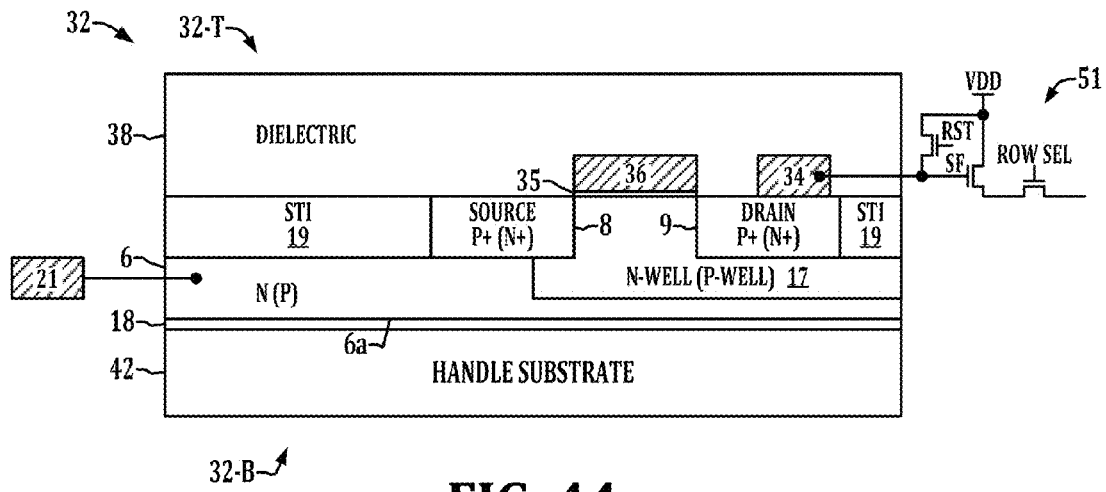
FIGS. 44-47 are partial sectional side elevation views illustrating fabrication of the bottom side contacted detector of FIG. 41.
Figure 45:
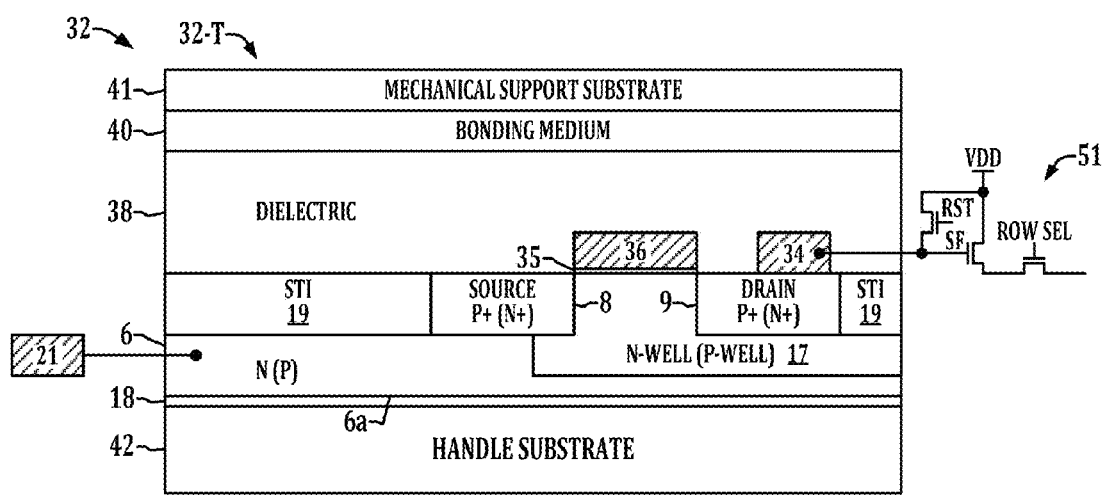
Figure 46:
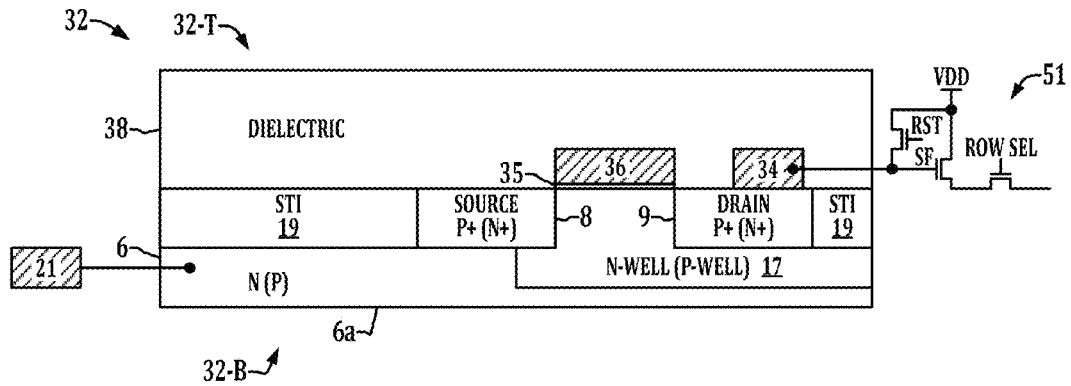
Figure 47:
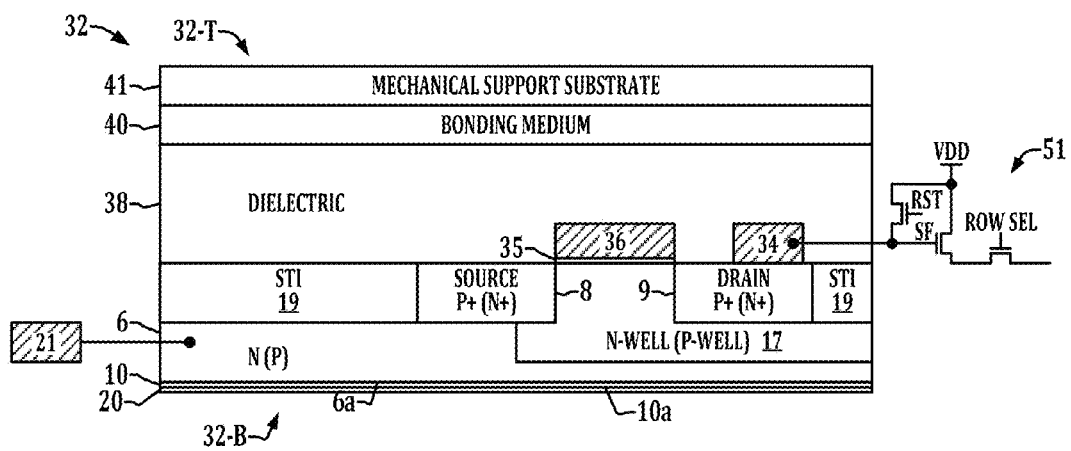

FIGS. 44-46 illustrate fabrication of the bottom side contacted detector 32 of FIG. 41. As seen in FIG. 44, the CMOS transistor structures including the source 8, the drain 9, shallow trench isolation (STI) regions 19, and the well 17 are formed in an silicon on insulator (SOI) structure which includes a semiconductor portion 6 overlying a buried oxide layer 18, and an underlying handle substrate 42 at the bottom side 32-B of the apparatus 32. In addition, the drain contact 34 and the gate oxide 35 and gate contact 36 are formed, along with an overlying dielectric layer 38. As seen in FIG. 45, and overlying mechanical support substrate 41 can be affixed above the dielectric 38 via a bonding medium 40, after which the handle substrate 42 and the buried oxide layer 18 can be removed from the bottom side 32-B as seen in FIG. 46. Thereafter, as seen in FIG. 47, the graphene layer 10 can be provided along the bottom side 6a of the semiconductor 6, and one or more optional layers can be added as seen in FIG. 47 to provide the detector apparatus 32 seen in FIG. 41. The graphene layer 10 can optionally be doped, and the optional coating layer 20 may be a protective layer, an anti-reflectance material, a filter, and/or a micro lens in certain embodiments, or may be omitted in other embodiments. Moreover, in embodiments employing a P type semiconductor structure 6, such as that shown in FIG. 42, a contact 14 is fabricated for electrical connection to the graphene 10.

There are other types of ultraviolet (400-100 nm; 3.10-12.4 eV), including without limitation ultraviolet A (UVA, 400-315 nm; 3.10-3.94 eV long wave, black light), ultraviolet B (UVB 315-280 nm; 3.94-4.43 eV medium wave), ultraviolet C (UVC 280-100 nm; 4.43-12.4 eV short wave, germicidal), near ultraviolet (NUV 400-300 nm; 3.10-4.13 eV visible to birds, insects and fish), middle ultraviolet (MUV 300-200 nm; 4.13-6.20 eV), far ultraviolet (FUV 200-122 nm; 6.20-10.16 eV), Hydrogen Lyman-alpha (H Lyman-α 122-121 nm; 10.16-10.25 eV), extreme ultraviolet (EUV 121-10 nm; 10.25-124 eV), vacuum ultraviolet (VUV 200-10 nm; 6.20-124 eV), X-rays (10-0.001 nm; 124 eV-1.24 MeV), soft X-rays (XUV 10-0.1 nm; 124 eV-12.4 keV), Hard X-rays (0.1-0.001 nm; 12.4 keV-1.24 MeV), electron bombardment imagers, etc. The disclosed detectors in FIGS. 1-40 can implement ultraviolet and X-ray detectors. FIGS. 7-40 are generally for a hybrid arrangement. The disclosed embodiments in FIGS. 41-47 can detect and image visible and near infrared wavelengths. In addition, the embodiments in FIGS. 41-47 can be used in an electron bombardment imager where electrons that are emitted from a phosphor or photocathode impact into the back surface of the semiconductor structure 6 and generate hole and electron pairs with one carrier type being integrated on the P+ (N+) doped region 8 and the other carrier type being conducted to either electrode 21 or 14 (electrode 14 is used as a contact to the graphene layer 10 for the embodiment shown in FIG. 42). In addition, the disclosed embodiments in FIGS. 41-47 can detect and image ultraviolet wavelength and x-ray wavelengths.

Figure 48:
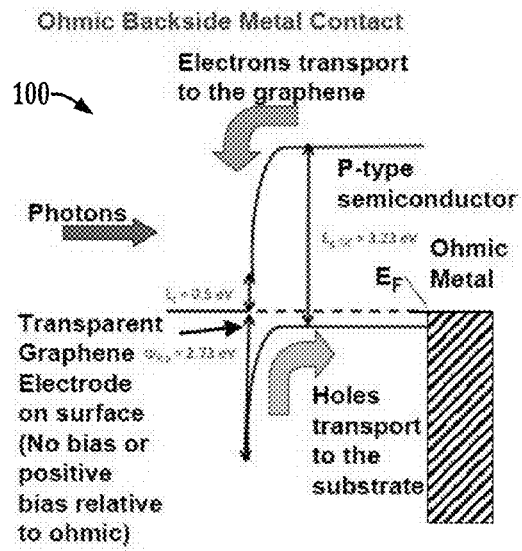
FIGS. 48 and 49 are band diagrams for UV/EUV transparent graphene electrodes on P type semiconductors which are representative of wide bandgap semiconductors such as silicon carbide.
Figure 49:
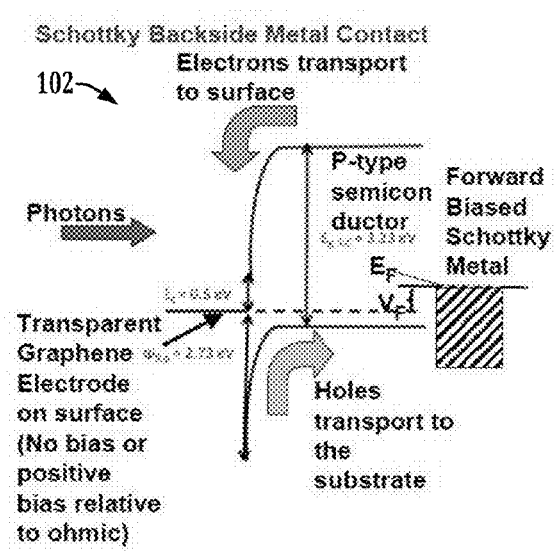
Figure 50:
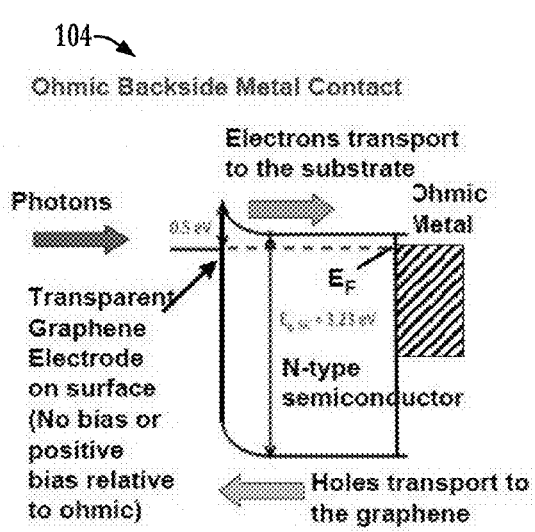
FIGS. 50 and 51 are band diagrams for UV/EUV transparent graphene electrodes on N type semiconductors which are representative of wide bandgap semiconductors such as silicon carbide.
Figure 51:
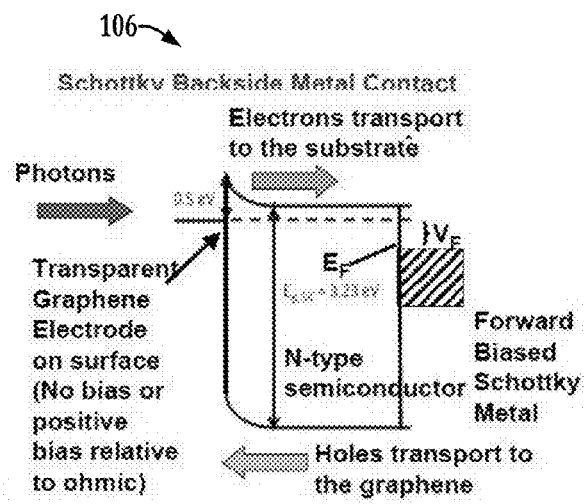
Figure 52:
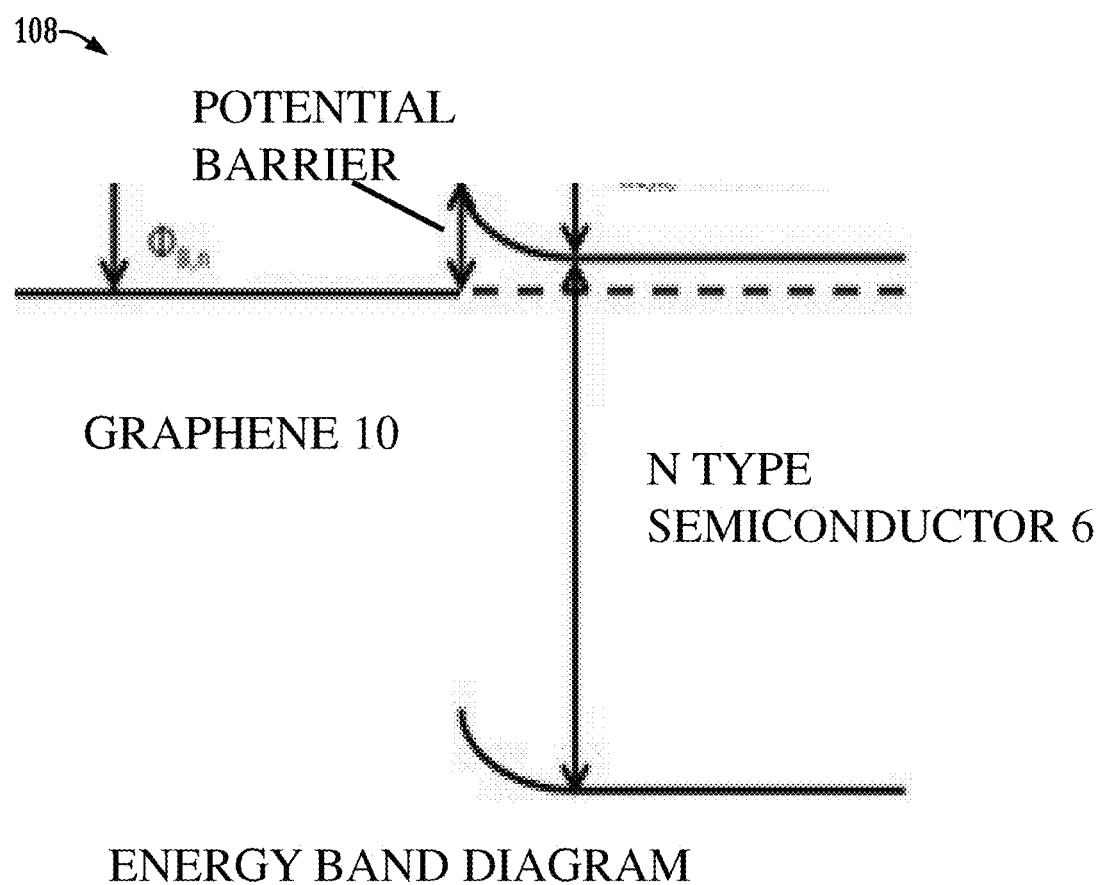
FIG. 52 is an energy band diagram showing a potential barrier for graphene and an N type semiconductor.

Referring also to FIGS. 48-52, FIGS. 48-51 illustrate band diagrams 100, 102, 104 and 106, respectively, and photocarrier generation and transport directions for transparent graphene electrodes on P type semiconductors (FIGS. 48 and 49) and for N type semiconductors (FIGS. 50 and 51), which represent wide bandgap semiconductors such as silicon carbide. In particular, the diagram 100 in FIG. 48 shows the case for a wide bandgap P type semiconductor using an ohmic metal contact with a transparent graphene electrode 10 at no bias or a positive bias relative to the ohmic contact. FIG. 49 shows the band diagram 102 for such a semiconductor using forward biased Schottky metal contact and a transparent graphene electrode at no bias or a positive bias relative to the Schottky metal contact. The band diagram 104 in FIG. 50 illustrates the case of an N type wide bandgap semiconductor (e.g., silicon carbide) with an ohmic metal contact in which the transparent graphene electrode 10 has no bias or a positive bias relative to the ohmic contact. FIG. 51 shows a band diagram 106 for such a semiconductor with a forward biased Schottky metal contact with the transparent graphene electrode at no bias or a positive bias relative to the contact. FIG. 52 illustrates an energy band diagram 108 showing a potential barrier for graphene 10 and an N type semiconductor structure 6.

The above examples are merely illustrative of several possible embodiments of various aspects of the present disclosure, wherein equivalent alterations and/or modifications will occur to others skilled in the art upon reading and understanding this specification and the annexed drawings. In addition, although a particular feature of the disclosure may have been illustrated and/or described with respect to only one of several implementations, such feature may be combined with one or more other features of the other implementations as may be desired and advantageous for any given or particular application. Also, to the extent that the terms "including", "includes", "having", "has", "with", or variants thereof are used in the detailed description and/or in the claims, such terms are intended to be inclusive in a manner similar to the term "comprising".

The following is claimed:

1. A detector apparatus, comprising:
a semiconductor structure with a first surface;
a graphene layer disposed over at least a portion of the first surface of the semiconductor structure and having an upper surface with a first portion configured to collect photogenerated carriers generated within the semiconductor structure and to establish a potential on the first surface of the semiconductor structure;
a first contact structure electrically connected to the semiconductor structure; and
a second contact structure electrically connected to a second portion of the upper surface of the graphene layer;
wherein the first and second contact structures are formed on a top side of the apparatus; and
wherein the semiconductor structure is of a first conductivity type and comprises an implanted or epitaxially grown region having a dopant concentration of the first conductivity type greater than a dopant concentration of the remainder of the semiconductor structure, wherein the first contact structure is an ohmic metal contact formed over at least a portion of an upper surface of the implanted or epitaxially grown region of the semiconductor structure.

2. A detector apparatus, comprising:
a semiconductor structure with a first surface;
a graphene layer disposed over at least a portion of the first surface of the semiconductor structure and having an upper surface with a first portion configured to collect photogenerated carriers generated within the semiconductor structure and to establish a potential on the first surface of the semiconductor structure;
a first contact structure electrically connected to the semiconductor structure; and
a second contact structure electrically connected to a second onion of the upper surface of the graphene layer;
wherein the first and second contact structures are formed on a for side of the apparatus; and
wherein the first contact structure is a Schottky metal contact formed over a portion of the first surface of the semiconductor structure, wherein the first contact structure is laterally spaced from the graphene layer.

3. A detector apparatus, comprising:
a semiconductor structure with a first surface;
a graphene layer disposed over at least a portion of the first surface of the semiconductor structure and having an upper surface with a first portion configured to collect photogenerated carriers generated within the semiconductor structure and to establish a potential on the first surface of the semiconductor structure;
a first contact structure electrically connected to the semiconductor structure; and
a second contact structure electrically connected to a second portion of the upper surface of the graphene layer;
a plurality of detector cells spaced from one another on the top side of the apparatus, with individual detector cells including:
a graphene layer disposed over the first surface of the semiconductor structure, the graphene layer having and a thickness of about 3.0 nm or less and an upper surface with a first portion configured to collect photogenerated carriers and to establish a potential on the first surface of the semiconductor structure,
a first contact structure electrically connected to the semiconductor structure, and
a second contact structure formed on a second portion of the upper surface of the graphene layer; and
at least one isolation structure separating first and second detector cells from one another
wherein the first and second contact structures are formed on a top side of the apparatus.

4. A detector apparatus, comprising:
a semiconductor structure with a first surface;
a graphene layer disposed over at least a portion of the first surface of the semiconductor structure and having an upper surface with a first portion configured to collect photogenerated carriers generated within the semiconductor structure and to establish a potential on the first surface of the semiconductor structure;
a first contact structure electrically connected to the semiconductor structure; and
a second contact structure electrically connected to a second portion of the upper surface of the graphene layer; and
a support substrate disposed along at least a portion of a bottom side of the semiconductor structure
wherein the first and second contact structures are formed on a top side of the apparatus.

5. The apparatus of claim 4, comprising a semiconductor epitaxial nucleation layer formed on a top side of the support substrate, wherein the semiconductor structure comprises an epitaxially grown semiconductor material formed over the nucleation layer.

6. A detector apparatus, comprising:
a semiconductor structure with a first surface;
a graphene layer disposed over at least a portion of the first surface of the semiconductor structure and having an upper surface with a first portion configured to collect photogenerated carriers generated within the semiconductor structure and to establish a potential on the first surface of the semiconductor structure;
a first contact structure electrically connected to the semiconductor structure; and a second contact structure electrically connected to a second portion of the upper surface of the graphene layer;

wherein the semiconductor structure has a bandgap more than 2.5 electron volts.

7. A detector apparatus, comprising:

a semiconductor structure with a first surface;

a graphene layer disposed over at least a portion of the first surface of the semiconductor structure and having an upper surface with a first portion configured to collect photogenerated carriers generated within the semiconductor structure and to establish a potential on the first surface of the semiconductor structure;

a first contact structure electrically connected to the semiconductor structure; and a second contact structure electrically connected to a second portion of the upper surface of the graphene layer;

wherein the second contact structure and the first contact structure have about the same voltage.

8. A detector apparatus, comprising:

a semiconductor structure with a first surface;

a graphene layer disposed over at least a portion of the first surface of the semiconductor structure and having an upper surface with a first portion configured to collect photogenerated carriers generated within the semiconductor structure and to establish a potential on the first surface of the semiconductor structure;

a first contact structure electrically connected to the semiconductor structure; and a second contact structure electrically connected to a second portion of the upper surface of the graphene layer;

wherein the first contact structure is electrically connected to the semiconductor structure via a CMOS transfer transistor.

9. A detector apparatus, comprising:

an epitaxial semiconductor structure with a first surface;

a graphene layer disposed directly on at least a portion of the first surface of the semiconductor structure to form a heterojunction with the semiconductor structure, an upper surface of the graphene layer having a first portion thereof configured to establish a potential on the first surface of the semiconductor structure and to collect photogenerated carriers from the semiconductor structure;

a first contact structure electrically connected to the semiconductor structure; and a second contact structure electrically connected to a second portion of the upper surface of the graphene layer.

10. The apparatus of claim 9, wherein the first and second contact structures are formed on a top side of the apparatus.

11. The apparatus of claim 9, wherein the semiconductor structure is of a first conductivity type and comprises an implanted or epitaxially grown region having a dopant concentration of the first conductivity type greater than a dopant concentration of the remainder of the semiconductor structure, wherein the first contact structure is an ohmic metal contact formed over at least a portion of an upper surface of the implanted or epitaxially grown region of the semiconductor structure.

12. The apparatus of claim 9, wherein the first contact structure is a Schottky metal contact formed over a portion of the first surface of the semiconductor structure, wherein the first contact structure is laterally spaced from the graphene layer.

13. The apparatus of claim 9, comprising:

a plurality of detector cells spaced from one another on the top side of the apparatus, with individual detector cells including:

a graphene layer having a thickness of about 3.0 nm or less disposed directly on the first surface of the semiconductor structure to form a heterojunction with the semiconductor structure, an upper surface of the graphene layer having a first portion configured to establish a potential on the first surface of the semiconductor structure and to collect photogenerated carriers from the semiconductor structure, a first contact structure electrically connected to the semiconductor structure, and a second contact structure formed on a second portion of the upper surface of the graphene layer; and at least one isolation structure separating first and second detector cells from one another.

14. The apparatus of claim 9, comprising a support substrate disposed along at least a portion of a bottom side of the semiconductor structure.

15. The apparatus of claim 14, comprising a semiconductor epitaxial nucleation layer formed on a top side of the support substrate, wherein the semiconductor structure comprises an epitaxially grown semiconductor material formed over the nucleation layer.

* * * * *